(12) United States Patent
Chen et al.

(10) Patent No.: US 11,233,088 B2
(45) Date of Patent: Jan. 25, 2022

(54) METAL ROUTING IN IMAGE SENSOR USING HYBRID BONDING

(71) Applicant: OmniVision Technologies, Inc., Santa Clara, CA (US)

(72) Inventors: Gang G. Chen, San Jose, CA (US); Shiyu Sun, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/900,722

(22) Filed: Jun. 12, 2020

(65) Prior Publication Data

US 2021/0391376 A1    Dec. 16, 2021

(51) Int. Cl.
*H01L 27/146* (2006.01)
*H01L 23/00* (2006.01)
*H01L 23/538* (2006.01)

(52) U.S. Cl.
CPC .... *H01L 27/14687* (2013.01); *H01L 23/5384* (2013.01); *H01L 23/5385* (2013.01); *H01L 23/5386* (2013.01); *H01L 24/06* (2013.01); *H01L 24/94* (2013.01); *H01L 27/14636* (2013.01); *H01L 27/14643* (2013.01)

(58) Field of Classification Search
CPC ......... H01L 27/14687; H01L 27/14636; H01L 27/14643; H01L 23/5384; H01L 23/5386; H01L 23/5385; H01L 24/06; H01L 24/94
USPC ....... 257/774, 292, 432, 435, 447, 308, 773, 257/E27.122, E27.13, E27.132, E27.133, 257/E27.151, E21.122, E21.513, E21.585, 257/E21.606, E31.097, E31.122, E31.127; 348/222.1, 294, 308; 438/118, 66, 667
See application file for complete search history.

(56) References Cited

U.S. PATENT DOCUMENTS

| | | | |
|---|---|---|---|
| 8,617,689 B2 | 12/2013 | Chen et al. | |
| 8,669,602 B2 | 3/2014 | Hayashi | |
| 8,947,566 B2* | 2/2015 | Kobayashi | ........ H01L 21/76898 348/294 |
| 9,123,615 B2 | 9/2015 | Lin et al. | |
| 9,257,472 B2* | 2/2016 | Soda | ................. H01L 27/14634 |
| 9,991,244 B2 | 1/2018 | Lin | |
| 10,957,732 B2* | 3/2021 | Ryoki | ............... H01L 27/14636 |
| 2009/0224345 A1* | 9/2009 | Lee | ................... H01L 27/14687 257/432 |
| 2020/0135617 A1* | 4/2020 | Shen | ................... H01L 23/5226 |

(Continued)

*Primary Examiner* — Dao H Nguyen

(74) *Attorney, Agent, or Firm* — Christensen O'Connor Johnson Kindness PLLC

(57) ABSTRACT

A method of routing electrical connections in a wafer-on-wafer structure comprises, bonding a metal bonding pad of a first wafer to a metal bonding pad of a second wafer; bonding first wafer to the second wafer with a material different from the metal bonding pads; forming metal interconnect structures connecting the metal bonding pad of the first wafer to a first device disposed within a first and second side of the first wafer; and forming metal interconnect structures connecting the metal bonding pad of the second wafer to a second and third devices disposed within the second wafer, to connect the first device to the second and third devices through the metal bonding pads, wherein the electrical connections of the devices between the first and second wafers do not have a through-via that passes completely through the first or the second wafer.

23 Claims, 12 Drawing Sheets

(56) References Cited

U.S. PATENT DOCUMENTS

2020/0328181 A1* 10/2020 Liu .................. H01L 21/78
2021/0043671 A1* 2/2021 Yoneda ............ H01L 27/14636

* cited by examiner

METAL ROUTING IN IMAGE SENSOR USING HYBRID BONDING

BACKGROUND INFORMATION

Field of the Disclosure

This disclosure relates to 3D integrated circuits, in particular to hybrid bonding of image sensors with metal routing.

Background

Wafer-on-wafer stacking is a process of packaging two or more wafers vertically, wherein each wafer can have different integrated circuits that perform a different function. A particular method of bonding between wafers has been created that is generally known as "hybrid bonding." Hybrid bonding is so named, because the method utilizes bonding between more than a single material. For example, hybrid bonding can include bonding between metals of two distinct wafers and also bonding of the silicon oxide between the two distinct wafers. Hybrid bonding can be achieved by thermocompression, the use of adhesives, and other processes.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
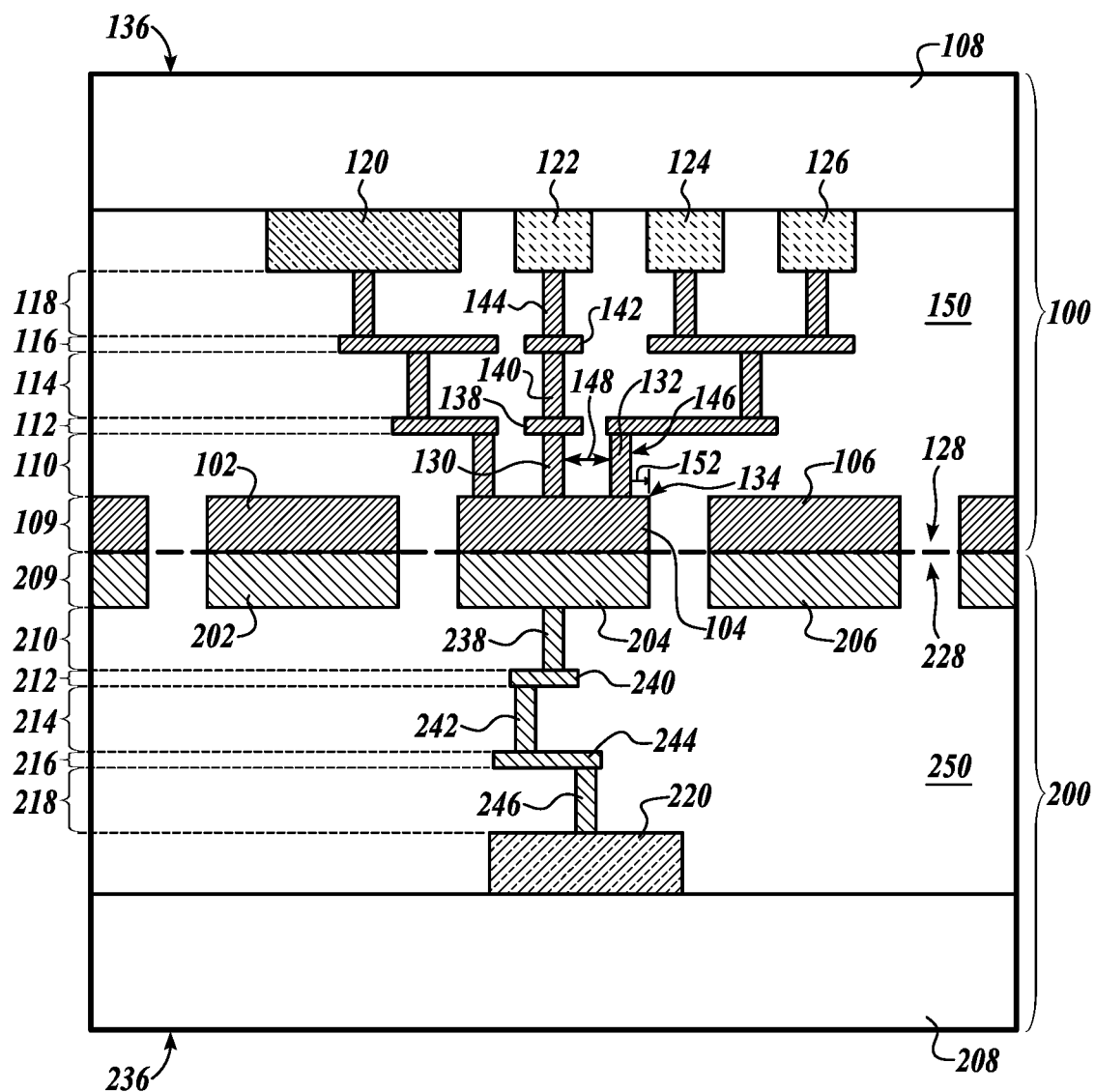
FIG. 1 is an example of a wafer-on-wafer structure in accordance with the present disclosure.

Examples are directed to image sensors, and devices and methods for fabricating image sensors are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Stacking wafers of ICs provide higher integration density, greater speeds and bandwidth, owing to the reduced length of interconnects between the stacked wafers. Vertically stacked wafer systems can be made, such that each wafer is capable of performing one or more specific functions. In a method to vertically stack wafers on top of one another, metal bonding pads can be fabricated on each respective juxtaposed side of the two wafers to be bonded through patterning, lithography, metallization, and similar processes. In addition to the metal-to-metal bond created by metal bonding pads, the exposed non-metal area (e.g., dielectric) of each of the two wafers is also used to bond the stacked wafers. Hybrid bonding has come to denote processes that use more than one bonding interfaces to achieve wafer-on-wafer packaging. Hybrid bonding can use adhesives, such as polyimides, thermocompression, diffusion bonding, pressure joining, and the like, to create metal-to-metal, insulator-to-insulator, and metal-to-insulator bonding to achieve vertically stacked wafers. It has been proposed to replace through-silicon vias or through-substrate vias (TSVs) to make electrical connections for the vertically stacked wafers, as opposed to other interconnect methods. In this disclosure, a "through-via" can be used to collectively refer to a through-silicon via or a through-substrate via or to both.

In examples, a method of routing electrical connections within a wafer-on-wafer structure comprises, bonding a metal bonding pad on a first side of a first wafer to a metal bonding pad on a second side of a second wafer, bonding the first side of the first wafer to the second side of the second wafer with a material different from the metal bonding pads, for example dielectric to dielectric bonding, forming one or more metal interconnect structures connected to the metal bonding pad on the first wafer, wherein the one or more metal interconnect structures are connected to multiple devices disposed within the first side and a second side of the first wafer, and forming one or more metal interconnect structures connected to the metal bonding pad on the second wafer, wherein the one or more metal interconnect structures are connected to one or more devices disposed within a first side and the second side of the second wafer, to connect the multiple devices of the first wafer to the one or more devices of the second wafer through the metal bonding pads, wherein the electrical connections of the devices between the first and second wafers do not have a through-via that passes completely through the first or the second wafer, i.e., the first and second wafers do not have a vertical connection structure that penetrates through semiconductor substrate and/or multi-interlayer dielectric to form connection within single wafer or between stacked wafers.

In examples, a hybrid bonded wafer-on-wafer semiconductor structure includes a first wafer having a metal bonding pad on a first side of the first wafer, a second wafer having a metal bonding pad on a second side of the second wafer, wherein the metal bonding pad of the first wafer is bonded to the metal bonding pad of the second wafer, the first side of the first wafer is further bonded to the second side of the second wafer with a material different from the metal bonding pads, for example dielectric to dielectric bonding, the metal bonding pad of the first wafer is connected to one or more metal interconnect structures electrically connected to one or more devices (e.g., a first device) disposed within the first side and a second side of the first wafer. The metal bonding pad of the second wafer is connected to one or more metal interconnect structures connected to one or more devices (e.g., a second device) disposed within a first side and the second side of the second wafer, and the one or more devices disposed within the first and second sides of the first wafer is connected to the one or more devices disposed within the first and second sides of the second wafer through the metal bonding pads. In the examples, using the metal bonding pads for connection between devices disposed within a first and a second wafer can result in saving one or more routing layers. Further, the thickness of the metal bonding pads allows large currents to be carried. Besides the electrical connection function of the metal bonding pads, other functions, such as light blocking for images sensors, thermal re-distribution for heat sensitive circuits, can be added.

A wafer in this disclosure refers to any semiconductor substrate, such as silicon, which can be used in the fabrication of microelectronic devices, including, but not limited to, integrated circuits, photodiodes, image sensors, and the like, and one or more material layers and/or structure formed on the semiconductor substrate. Generally, wafers can be cut from a single larger semiconductor crystal into thin disks (i.e., wafers). In the present disclosure, the "semiconductor wafer" or simply "wafer" can refer to any type and shape of substrate used for forming semiconductor devices thereon. For example, substrates can include single crystal substrates, semiconductor on insulator (SOI) substrates, doped silicon bulk substrate, and epitaxial film on semiconductor (EPI) substrates and the like. Further, although the various embodiments can be primarily described with respect to materials and processes compatible with silicon-based semiconductor materials (e.g., silicon and alloys of silicon with germanium and/or carbon), the present disclosure is not limited in this regard. Rather, the various embodiments can be implemented using any types of semiconductor materials.

Widely available processes to fabricate devices, metal bonding pads, hybrid bonds of like materials and different materials, and interconnect structures of all types within wafers are available to use in this disclosure. Such processes need not be fully described since the present disclosure is related to particular structures. Devices can refer to transistors, resistors, photodiodes, doped regions, and the like. Interconnect structures can refer to vias, metallization structures, intermediate metal routing traces, and the like that electrically connect a device or another structure within a wafer resulting in a connection to a metal bonding pad. As used throughout this disclosure, a hybrid bond of a first wafer to a second wafer includes at least metal-to-metal bonding and another different bonding of materials other than metal, such as dielectric-to-dielectric or insulator-to-insulator, and the like. Further, a hybrid bond can include bonding of different materials, such as metal to metal, metal to insulator, or insulator to insulator.

To illustrate, FIG. 1 shows a portion of a vertically stacked wafer-on-wafer structure comprising a first 100 wafer bonded to a second 200 wafer using hybrid bonding. The first wafer 100 has a first side 128 and a second side 136 opposite to the first side 128. The second wafer 200 has a first side 236 and a second side 228 opposite to the first side 236. The first side 128 of the first wafer 100 is bonded to the second side 228 of the second wafer 200. The first wafer 100 includes a substrate 108 and a multi-interlayer dielectric structure 150 comprised of a plurality of dielectric layers in which metal features can be formed, formed on the substrate 108. The second wafer 200 includes a substrate 208 and a multi-interlayer dielectric structure 250 comprised of a plurality of dielectric layers in which metal features can be formed, formed on the substrate 208. The first wafer 100 includes a layer 109 of metal bonding pads 102, 104, and 106 embedded in a dielectric material layer of the multi-interlayer dielectric structure 150, wherein the dielectric material, such as silicon oxide, silicon nitride, encloses the metal bonding pads 102, 104, 106 and one or more metal interconnect structure. The second wafer 200 includes a layer 209 of metal bonding pads 202, 204, and 206 embedded in a dielectric material layer of the multi-interlayer dielectric structure 250, wherein the dielectric material, such as silicon oxide, silicon nitride, encloses the metal bonding pads 202, 204, 206 and one or more metal interconnect structure.

Each of the metal bonding pads 102 104, and 106 has a first surface formed on the first side 128 of the first wafer 100, and a second surface opposite to the first surface thereof. Each of the metal bonding pads 202, 204, and 206 has a first surface (e.g., top metal surface) formed on the second side 228 of the second wafer 208, and a second surface opposite to the first surface thereof. The first surface (e.g., top metal surface) of metal bonding pad 102 of the first wafer 100 is bonded with the first surface (e.g., top metal surface) of metal bonding pad 202 and electrically connected metal bonding pad 102 to metal bonding pad 202. The first surface of metal bonding pad 104 of the first wafer 100 is bonded with the first surface of metal bonding pad 204 and electrically connected metal bonding pad 104 to metal bonding pad 204. The first surface of metal bonding pad 106 of the first wafer 100 is bonded with the first surface of metal bonding pad 206 and electrically connected metal bonding pad 106 to metal bonding pad 206.

In some embodiments, the metal bonding pads 102, 104, 202, 204, 206 are formed using a damascene technique. For example, the dielectric material is deposited as a layer on the first wafer 100 (e.g., on the first side 128 of the first wafer 100), patterned using lithography, and etched to form openings or recesses. The openings in the dielectric material layer is then filled with a conductive material e.g., aluminum, copper, with excess portions of the conductive material are removed from over the top surface of the dielectric material, for example by chemical mechanical polishing (CMP), an etch process, or combinations thereof.

Areas of the dielectric material layers that do not include the metal bonding pads can be further bonded to each other, through dielectric to dielectric bonding. Accordingly, wafer 100 is bonded to wafer 200 through a hybrid bonding method which utilizes metal-to-metal bonding and dielectric-to-dielectric bonding. The method of bonding can include, but is not limited to, adhesives, such as polyimides, thermocompression, diffusion bonding, pressure joining, and the like.

In one example, metal bonding pads 104 and 204 are further connected to one or more metal structures that connect the metal bonding pads 104 and 204 to at least one device in the wafers 100 and 200, respectively. Accordingly, metal bonding pads 104 and 204 serve a bonding function and additionally serve as an electrical connection between a device or devices formed in one wafer 100 to one or more devices formed in a second wafer 200.

In one example, the pair of metal bonding pads 104 and 204 are of similar dimension e.g., substantially of same width and length. The pair of metal bonding pads 104 and 204 are completely superposed with each other. In one example, the width of metal bonding pads 104 and 204 is greater than or equal to 1 µm. In one example, the width of metal bonding pads 104 and 204 is about 1 µm to about 3 µm. The pairs of metal bonding pads 106, 206 and 102, 202 are provided as "dummy" pads, to provide an even or level bonding surface to relieve bonding stress and improve reliability. In the illustrated example, dummy pads, such as metal bonding pads 106, 206 and 102, 202 are bonding pads disposed to provide bonding strength and further for blocking stray lights. Dummy pads are not configured to provide electrical connections between wafers 100, 200. The pairs of metal bonding pads 106, 206 and 102, 202 function as dummy pads can be the same width as the function pads e.g., metal bonding pads 104 and 102, from about 1 µm to about 3 µm. In some embodiments, dummy pads can be different length or width as the function pads.

In one example, the first wafer 100 and second wafer 200 each include a plurality of dielectric layers forming the multi-interlayer dielectric structures 150, 250, respectively. These dielectric layers have interconnecting conducting metal structures formed therein that serve as electrical routing between devices in the first wafer 100 to devices in the second wafer 200 through the metal bonding pads 104, 204. For example, the first wafer 100 includes vertical interconnect structures (e.g., vias) in via layers 110, 114, and 118, and horizontal metal interconnect layers 112 and 116 embedded in multi-interlayer dielectric layers formed on the first wafer substrate, disposed between a top via and a bottom via layer. Each of via layers 110, 114, and 118 includes vertical interconnect structures (e.g., vias) formed in an inter-layer dielectric layers, for example, vertical interconnect structures (e.g., vias), such as via 130, 132 in via layer 110 are formed in an inter-layer dielectric layer using damascene technique. Each of horizontal metal interconnect layers 112 and 116 includes metal interconnects or metal routing traces formed in an inter-layer dielectric material layer using damascene technique, for example, horizontal interconnect structures (or metal traces) such as metal interconnect 138 in horizontal metal interconnect layer 112 are formed in an inter-layer dielectric material layer using damascene technique. In some embodiment, each of inter-layer dielectric material layers is formed of silicon oxide. In some embodiment, inter-layer dielectric layer is formed of low oxide material. Each of vertical interconnect structures in via layers 110, 114, 118 is configured to electrically connect horizontal metal interconnect structures (e.g., metal routing trace) between horizontal metal interconnect layers 112 and 116 establishing electrical connection between horizontal metal interconnect layers 112 and 116. Similarly, the second wafer 200 includes a multi-layer interconnection structures 250 formed of a plurality of inter-layer dielectric layers with interconnect structures. The second wafer 200 includes via layers 210, 214, and 218 having vertical interconnect structures formed in the inter-layer dielectric layers of the multi-interlayer dielectric structure 250 on the second wafer substrate 208. Horizontal metal interconnect layers 212 and 216 are formed in the inter-layer dielectric layers of the multi-interlayer dielectric structure 250 on the second wafer substrate 208, disposed between a top via layer and a bottom via layer. Each of vertical interconnect structures in via layers 210, 214, 218 is configured to electrically connect horizontal metal interconnect structures (e.g., metal routing trace) between horizontal metal interconnect layers 212 and 216 establishing electrical connection between horizontal metal interconnect layers 212 and 216. The number of via and metal layers is representative and is not limited, as fewer or more via and metal layers can be provided.

In one example, a plurality of vertical interconnect structures (e.g. vias) in the via layer 118 are connected to devices 122, 124, 126, or wire bonding pad 120, respectively, and the one via in the via layer 218 is connected to wire bonding pad 220. In one example, the devices 122, 124, and 126 can be transistors. In one example, the devices 122, 124, and 126 are transistor devices e.g., pixel transistors, and the wafer 100 is a pixel wafer having photodiodes, and the wafer 200 is a logic wafer having logic circuits. However, a pixel wafer and a logic wafer are meant to be representative, and the disclosure is not thereby limited.

To illustrate the use of metal bonding pads 104 and 204 in the signal transmission path, vias 246, 242, 238 and metal routing traces 244, 240 in the second wafer 200 lead from the wire bonding pad 220 in the second wafer 200 to the metal bonding pad 204, while vias 130, 140, 144 and metal routing traces 138, 142 lead from the metal bonding pad 104 in the first wafer 100 to the device 122. Thereby, establishing a signal transmission path from the wiring bonding pad 220 in the second wafer 200 to the device 122 in the first wafer 100 through the metal bonding pads 104, 204.

Therefore, according to one example, the metal bonding pads 104 and 204 of a hybrid bonded first 100 and second 200 wafer provide electrical connections of devices wholly within the first 128 and second 136 sides of wafer 100 and first 236 and second 228 sides of wafer 200. This differs from the use of through-silicon vias, i.e., vertical connection structure that pass completely through from one silicon substrate wafer to a bonded wafer. It is further appreciated, similarly for semiconductor device structure that use of through-substrate vias within one wafer to establish electrical connection, also need to allocate certain amount of usable wafer and metal interconnect area, where no single routing traces or circuit element (e.g., transistors) may be disposed in order to form such through-substrate vertical connection structures for reliability concerns. In other words, the present invention form electrical connections between wafers using metal bonding pads, metal interconnect structures and vias without need to use through-silicon or through-substrate vias, thus can increase usable area on the wafers for circuitry formation or signal routing. In the illustrated example, the first wafer 100 and second wafer 200 are bonded though hybrid bonding such that a wire bonding pad 220 in the second wafer 200 can be connected to multiple devices (e.g., devices 122, 124, 126) through single metal bonding pad 104. Alternatively, the present disclosure provides a hybrid bonding scheme that can route electrical connections between a device or a wire bonding pad disposed in one wafer to multiple devices in another wafer.

In one example, more than one vertical interconnect structures (e.g., vias) in the via layer 110, for example vias 130, 132, are electrically coupled to the metal bonding pad 104 of the first wafer 100, and the one via in the via layer 218 is electrically coupled to the metal bonding pad 204 of the second wafer 200. The width of the metal bonding pad 104 of the first wafer 100 is configured to allow for multiple vertical interconnect structures or vias connected thereto. In one example, the minimum critical dimension 148 between the edge of via 130 to the adjacent edge of via 132 is, for example about 100 nm, and the minimum margin 152 between an outside edge 146 of the via 132 and an edge 134 of the metal bonding pad 104 is, for example 50 nm. Therefore, the metal bonding pad 104 can accommodate more than one via to provide multiple electrical connection paths.

Figure 2:
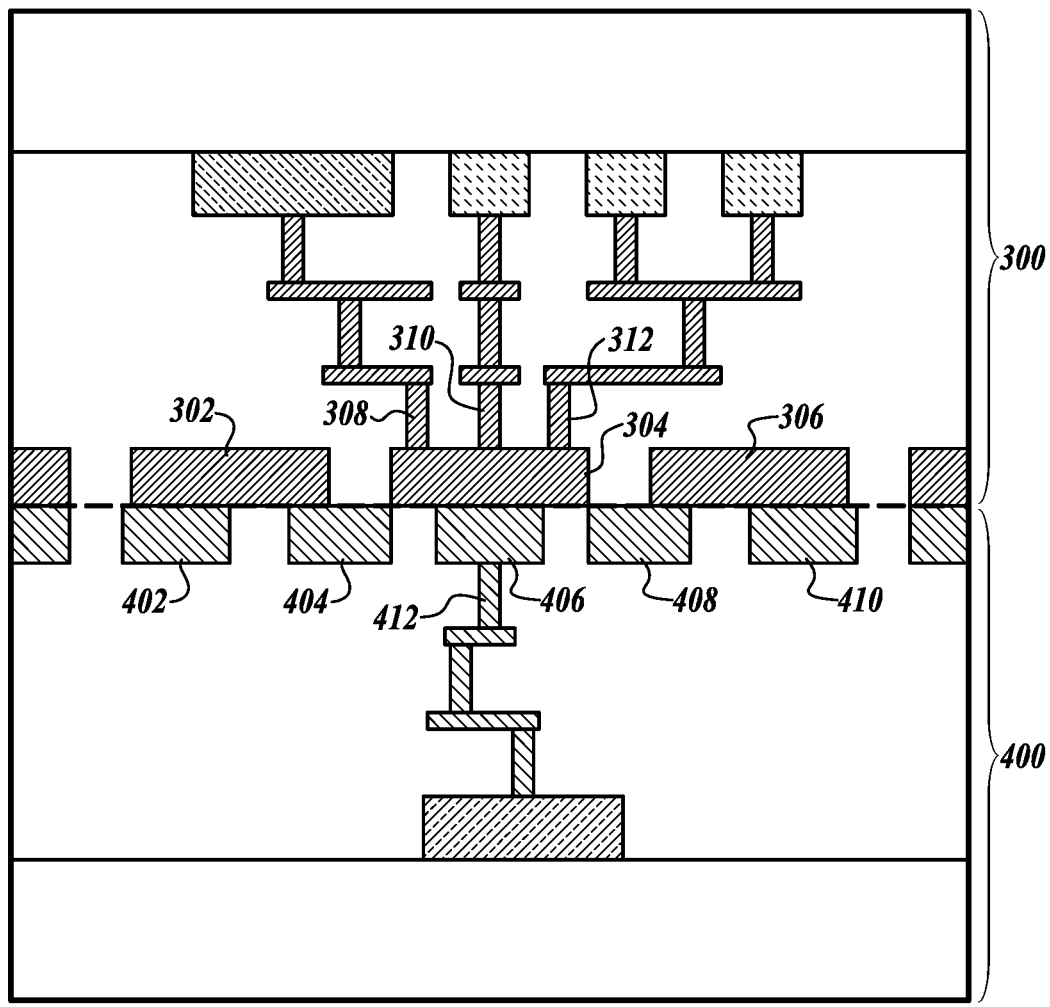
FIG. 2 is an example of a wafer-on-wafer structure in accordance with the present disclosure.

In FIG. 2, a first wafer 300 is bonded to a second wafer 400 using hybrid bonding, which includes metal-to-metal bonding and at least one other different material bonding, such as insulator-to-insulator bonding (e.g., dielectric-to-dielectric bonding), or the like. The structure of FIG. 2 is similar in respects to the structure of FIG. 1, with the following differences. Descriptions on elements and structures similar to FIG. 1 may be omitted herein for simplicity.

In FIG. 2, the length or width of the metal bonding pads 402, 404, 406, 408, and 410 of the second wafer 400 can be of different length or width as compared to the length or width of the metal bonding pads 302, 304, and 306 of the first wafer 300. In one example, a metal bonding pad 406 of the second wafer 400 has a smaller length or width and can be bonded completely overlapping with a metal bonding pad 304 of the first wafer. In one example, a metal bonding pad 408 of the second wafer 400 can be bonded overlapping partially and less than a majority of the width with a metal bonding pad 306 of the first wafer 300. In one example, a metal bonding pad 410 of the second wafer 400 can be bonded overlapping partially and more than a majority of the width with the metal bonding pad 306 of the first wafer 300. In some embodiments, a metal bonding pad of the first wafer 300 can be bonded overlapping and bonded with one or more metal bonding pads of the second wafer 400. For example, the metal bonding pad 306 overlaps with and is bonded in contact with both metal bonding pads 408 and 410 formed on the second wafer 400. For example, the entire top surface of metal bonding pad 406 of the second wafer 400 is overlapped and bonded in contact with a portion of metal bonding pad 304 of the first wafer 300 to form electrical connection between first and second wafers 300, 400. For another example, metal bonding pad 408 of the second wafer 400 is overlapped partially with metal bonding pad 306 and partially with dielectric material. In one example, the metal bonding pad 406 of the second wafer 400 that is smaller in width and is completely overlapped by the metal bonding pad 304 of the first wafer 300 is connected to one via 412, while the metal bonding pad 304 is connected to multiple vias 308, 310, and 312. In some embodiments, the metal bonding pads 302 and 306 of the first wafer 300, and the metal bonding pads 402, 404, and 410 of the second wafer 400 are dummy pads to provide more metal coverage on wafer and an even or level surface to provide bonding support and relieve bonding stress induced during hybrid bonding process. Therefore, the hybrid bonded first 300 and second 400 wafers have electrical connections wholly within the wafers through the use of the metal pads 304 and 406 in addition to being used for hybrid bonding between stacked wafers, maximizing the area use of wafer and metal interconnection layers.

Figure 3:
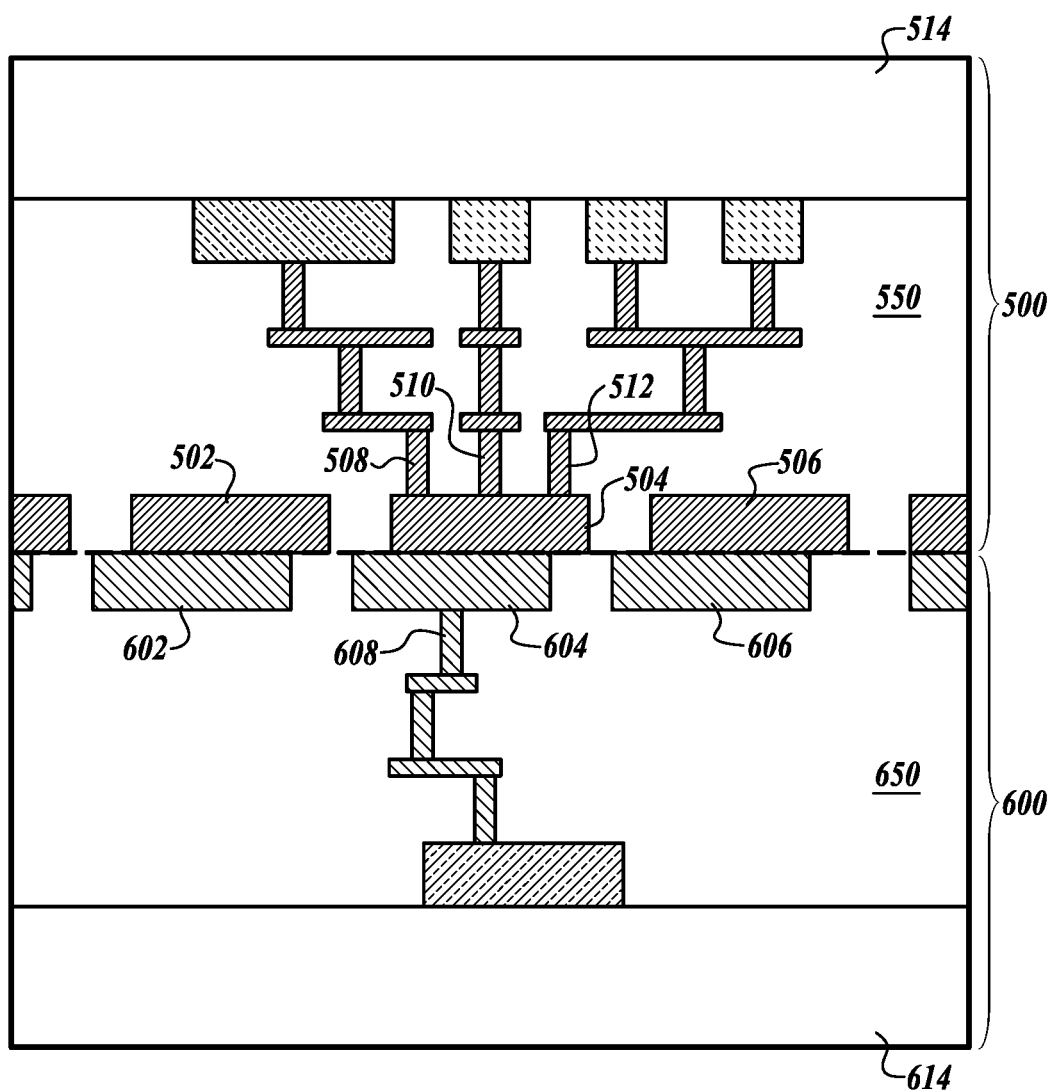
FIG. 3 is an example of a wafer-on-wafer structure in accordance with the present disclosure.

In FIG. 3, a first wafer 500 is bonded to a second wafer 600 using hybrid bonding, which includes metal-to-metal bonding and at least one other different material bonding, such as insulator-to-insulator bonding (e.g., dielectric-to-dielectric bonding), or the like. The structure of FIG. 3 is similar in respects to the structure of FIG. 1, with the following differences.

In FIG. 3, the width of the metal bonding pads 602, 604, and 606 of the second wafer 600 is the same as the width of the metal bonding pads 502, 504, and 506 of the first wafer 500. However, the metal bonding pads 602, 604, and 606 of the second wafer 600, while being of similar length or width as compared to the metal bonding pads 502, 504, and 506 of the first wafer 500, are shifted with respect to the metal bonding pads 502, 504, and 506 of the first wafer 500, so as to be bond partially overlapping, meaning that metal bonding pads 602, 604, and 606 bond partially over corresponding metal bonding pads 502, 504, and 506, and also extend over a bonding surface of the multi-interlayer dielectric structure 550 of the first wafer 500. Similarly, metal bonding pads 502, 505, and 506 extend over the multi-interlayer dielectric structure 650 of the second wafer 600. In one example, the minimum overlap of metal bonding pads 504 and 604 may be configured based on process design rule, for example about 200 nm. In one example, the metal bonding pad 604 of the second wafer 600 is connected to one via 608, while the metal bonding pad 504 is connected to more than one vias 508, 510, and 512 to establish single to multiple electrical connections such that a signal from a single device or single wire bonding pad of second wafer 600 can be transmitted to multiple device and/or wire bonding pad. The metal bonding pads 502 and 506 of the first wafer 500, and the metal bonding pads 602 and 606 are dummy pads to provide metal coverage and an even or level surface and relieve bonding stress. It is appreciated that the actual number of dummy pads disposed on first and second wafers 500, 600 may be arranged based on the amount of metal coverage required to provide an even or level surface for relieving bonding stress. Therefore, the hybrid bonded first 500 and second 600 wafers have electrical connections wholly within the wafers through the use of the metal pads 504 and 606 in addition to being used for hybrid bonding.

Figure 4:
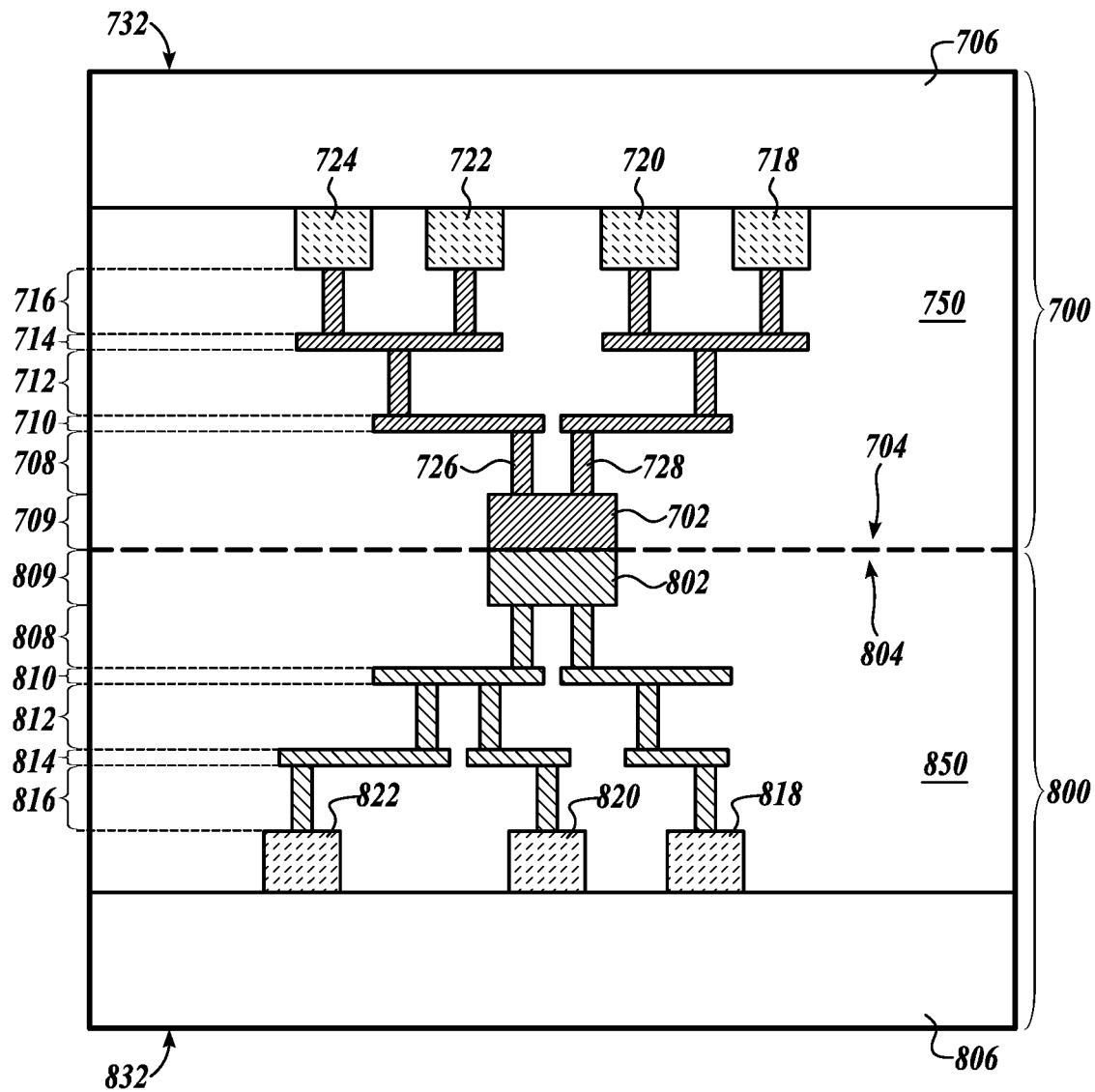
FIG. 4 is an example of a wafer-on-wafer structure in accordance with the present disclosure.

FIG. 4 shows a portion of a first and second vertically stacked wafer-on-wafer structure comprising a first wafer 700 bonded to a second wafer 800 using hybrid bonding forming electrical connections between multiple devices on first 700 and second wafer 800. The first wafer 700 has a first side 704 and a second side 732 opposite to the first side 704. The second wafer 800 has a first side 832 and a second side 804 opposite to the first side 832. The first side 704 of the first wafer 700 is bonded to the second side 804 of the second wafer 800. The first wafer 700 includes a substrate 706 and a multi-interlayer dielectric structure 750 comprised of a plurality of dielectric layers in which metal features can be formed, formed on the substrate 706. The second wafer 800 is formed from a substrate 806 and a multi-interlayer dielectric structure 850 comprised of a plurality of dielectric layers in which metal features can be formed, formed on the substrate 806. The metal bonding pad 702 is embedded in a dielectric material layer 709 of the multi-interlayer dielectric structure 750, wherein the dielectric material, such as silicon oxide, silicon nitride, encloses the metal bonding pad 750 and one or more metal interconnect structure. The metal bonding pad 802 is embedded in a dielectric material layer 809 of the multi-interlayer dielectric structure 850, wherein the dielectric material, such as silicon oxide, silicon nitride, encloses the metal bonding pad 802 and one or more metal interconnect structure.

Areas of the multi-interlayer dielectric structures 750 and 850 that do not include metal bonding pads can be further bonded to each other through dielectric to dielectric bonding. Accordingly, first wafer 700 is bonded to second wafer 800 through a hybrid bonding method which utilizes metal-to-metal bonding and insulator-to-insulator (e.g., dielectric to dielectric) bonding. The method of bonding can include, but is not limited to, adhesives, such as polyimides, thermocompression, diffusion bonding, pressure joining, and the like.

In one example, metal bonding pads 702 and 802 are further connected by one or more metal interconnection structures that connect the metal bonding pads 702 and 802 to at least one device in the wafers 700 and 800. Accordingly, metal bonding pads 702 and 802 serve a bonding function and additionally serve as an electrical connection for a device in one wafer 700 to a device in a second wafer 800.

The pair of metal bonding pads 702 and 802 are of similar width and are completely superposed with each other. In one example, the width of metal bonding pads 702 and 802 is greater than or equal to 1 µm. In one example, the width of metal bonding pads 702 and 802 is about 1 µm to about 3 µm. Although a single metal bonding pad pair is illustrated, it is within the scope of this disclosure to include a plurality of metal bonding pad pairs in any of the examples illustrated.

In one example, the first wafer 700 and the second wafer 800 each include a multi-interlayer dielectric structure comprising a plurality of dielectric layers having interconnecting conducting metal structures formed therein that serve as electrical routing between devices in the first wafer 700 to devices in the second wafer 800 through the metal bonding pads 702, 802. For example, the first wafer 700 includes multi-layer interconnection structure 750 comprising of vertical interconnect structures or vias in via layers 708, 712, and 716, and horizontal metal interconnect layers 710 and 714, formed between a top via and a bottom via layer. Each of via layers 708, 712, and 716 includes vertical interconnect structures or vias and an inter-layer dielectric material layer, wherein vertical interconnect structures are embedded in the inter-layer dielectric material layer. Similarly, each of horizontal metal interconnect layers 710 and 714 includes horizontal metal interconnect structures or metal traces and inter-layer dielectric material layer, wherein horizontal metal interconnect structures or metal traces are embedded in in inter-layer dielectric material layer. Vertical interconnection structures or vias in via layers 708, 712, and 716 are configured to establish connections between corresponding metal pads of horizontal metal interconnect layers. Similarly, the second wafer 800 includes a plurality of layers with interconnect structures. The second wafer 800 includes a multi-layer interconnection structures 850 comprising of via layers 808, 812, and 816, and horizontal metal interconnect layers 808 and 814, disposed between a top via and a bottom via layer. The number of via and metal layers is representative and is not limited, as fewer or more via and metal layers can be provided.

In one example, each of vertical interconnection structures (or vias) in the via layer 716 are connected to multiple devices 718, 720, 722, and 724, and the vias in the via layer 816 are connected to multiple devices 818, 820, and 822. In one example, the devices 718, 720, and 722 can be transistors. In one example, the devices 718, 720, and 722 are pixel transistors, and the wafer 700 is a pixel wafer having photodiodes, and the wafer 800 is a logic wafer having logic circuits configured for controlling operation of the photodiodes and processing signals received from photodiodes. However, a pixel wafer and a logic wafer are meant to be representative, and the disclosure is not thereby limited.

In some embodiments, the metal bonding pad 702 is operative to form connection between multiple devices on the second wafer 800 to multiple devices on the first wafer 700. In one example, more than one via in the via layer 708 is electrically connected to the metal bonding pad 702 of the first wafer 700, and more than one via in the via layer 808 are connected to the metal bonding pad 802 of the second wafer 800. Therefore, according to one example, the metal bonding pads 702 and 802 of a hybrid bonded first wafer 700 and second wafer 800 are used for forming electrical connections and routing signals among devices formed on the first second 732 side of first wafer 700 and first side 832 of second wafer 800 without need to using TSVs, thereby increase amount of usable area on wafers.

The width of the metal bonding pads 702, 802 of the first 700 and second 800 wafers allow for multiple vias connected thereto. In one example, the minimum critical dimension between the edge of via 726 to the adjacent edge of via 728 is, for example about 100 nm, and the minimum margin between the outside edge of the via 728 and the edge 730 of the metal bonding pad 702 is, for example 50 nm. Therefore, the metal bonding pads 702, 802 can accommodate more than one vias.

Figure 5:
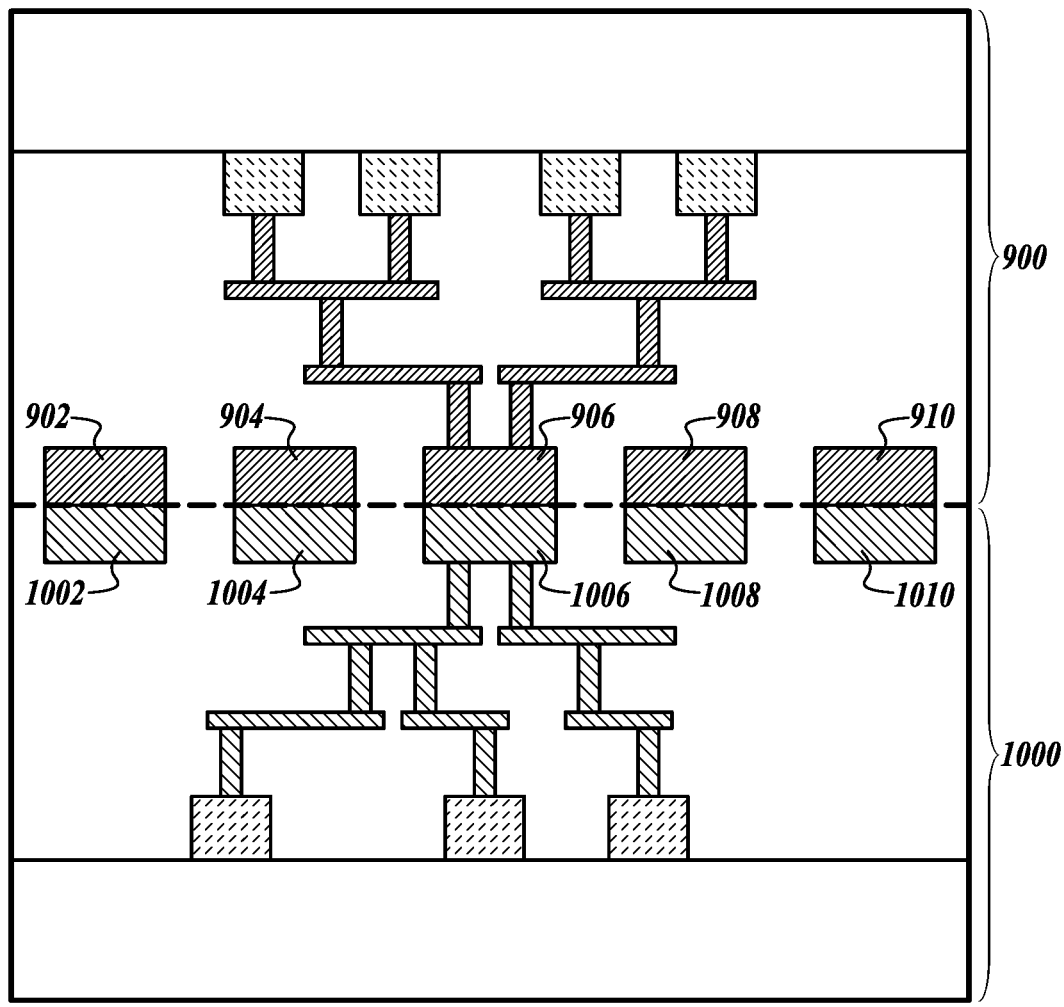
FIG. 5 is an example of a wafer-on-wafer structure in accordance with the present disclosure.

In FIG. 5, a first wafer 900 is bonded to a second wafer 1000 using hybrid bonding, which includes metal-to-metal bonding and at least one other different material bonding, such as dielectric-to-dielectric, insulator-to-insulator bonding, or the like. The structure of FIG. 5 is similar in respects to the structure of FIG. 4, with the following differences.

In FIG. 5, a metal bonding pad 906 of wafer 900 is bonded to metal bonding pad 1006 of wafer 1000. In addition to providing wafer-to-wafer bonding, metal bonding pads 906 and 1006 can provide more than one electrical connection within each of the wafers 900 and 1000. The first wafer 900 includes additional dummy metal bonding pads 902, 904, 908, and 910, and the second wafer 1000 includes additional dummy metal bonding pads 1002, 1004, 1008, and 1010 to bond with the metal bonding pads 902, 904, 908, and 910. The width of the dummy metal bonding pads 902, 904, 908, 910, and the dummy metal bonding pads 1002, 1004, 1008, 1010 can be the same width as the metal bonding pads 906 and 1006 used for the electrical connection function. In one example, the minimum separation between an edge of a metal bonding pad 906 or 1006 serving an electrical connection function to an adjacent edge of a dummy metal bonding pad, such as 908 and 1006 is, for example about 100 nm.

Figure 6:
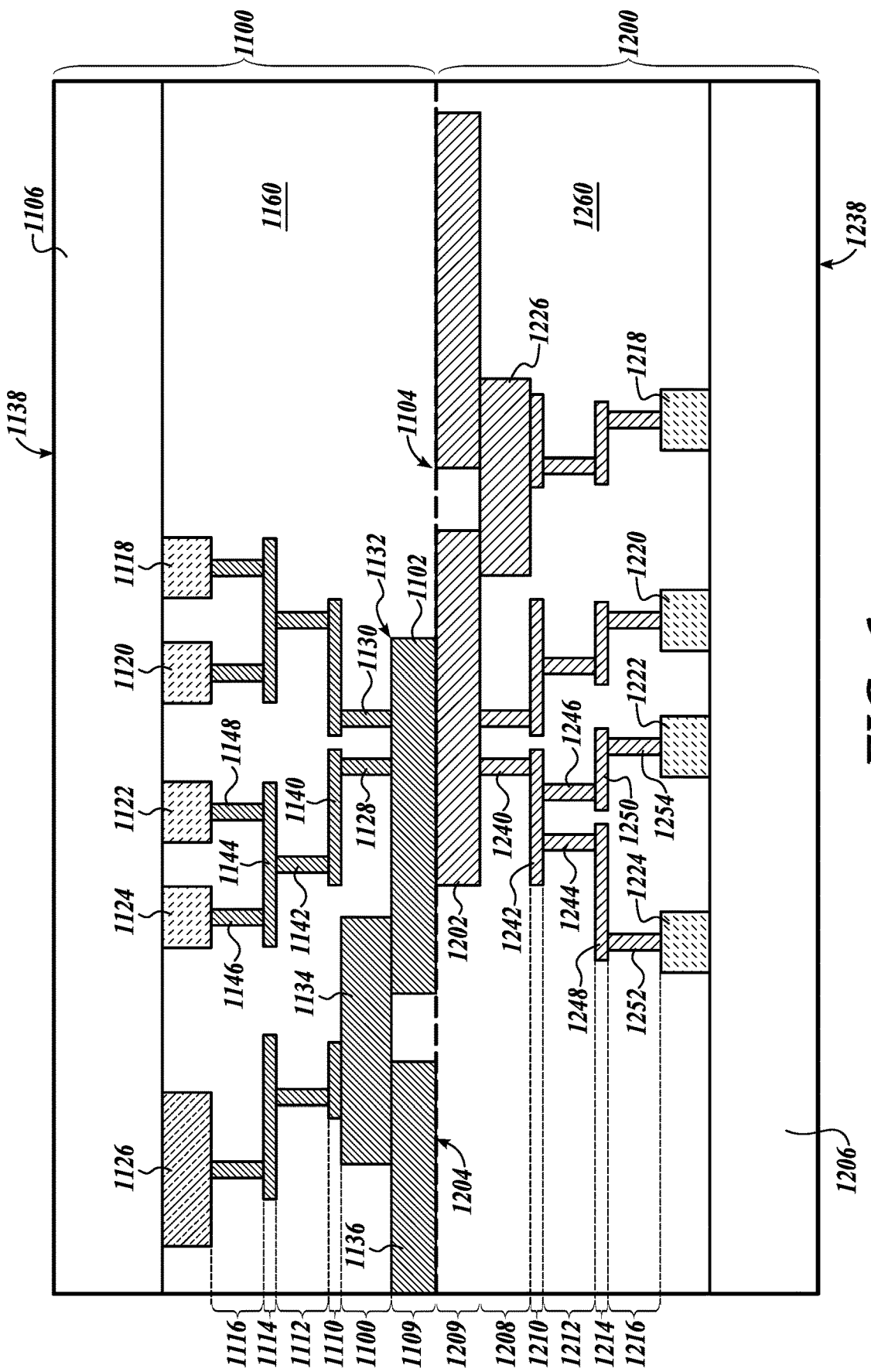
FIG. 6 is an example of a wafer-on-wafer structure in accordance with the present disclosure.

FIG. 6 shows a portion of a first and second vertically stacked wafer-on-wafer structure comprising a first wafer 1100 bonded to a second wafer 1200 using hybrid bonding forming electrical connections between multiple devices on first 1100 and second wafer 1200. The first wafer 1100 has a first side 1104 and a second side 1138 opposite to the first side 1104. The second wafer 1200 has a first side 1238 and a second side 1204 opposite to the first side 1238. The first side 1104 of the first wafer 1100 is bonded to the second side 1204 of the second wafer 1200. The first wafer 1100 includes a substrate 1106 and a multi-interlayer dielectric structure 1160 comprised of a plurality of dielectric layers in which metal features can be formed, formed on the substrate 1106. The second wafer includes a substrate 1206 and a multi-interlayer dielectric structure 1260 comprised of a plurality of dielectric layers in which metal features can be formed, formed on the substrate 1206. The metal bonding pad 1102 is embedded in a dielectric material layer 1109 of the multi-interlayer dielectric structure 1160, wherein the dielectric material, such as silicon oxide, silicon nitride, encloses the metal bonding pads 1136 and 1102 and one or more metal interconnect structure. The metal bonding pad 1202 is embedded in a dielectric material layer 1209 of the multi-interlayer dielectric structure 1260, wherein the dielectric material, such as silicon oxide, silicon nitride, encloses the metal bonding pad 1202 and one or more metal interconnect structure.

Areas of the multi-interlayer dielectric structures 1160 and 1260 that do not include metal bonding pads can be further bonded to each other through dielectric to dielectric bonding. Accordingly, wafer 1100 is bonded to wafer 1200 through a hybrid bonding method which utilizes metal-to-metal bonding and insulator-to-insulator (e.g., dielectric to dielectric) bonding. The method of bonding can include, but is not limited to, adhesives, such as polyimides, thermo-compression, diffusion bonding, pressure joining, and the like.

Metal bonding pads 1102 and 1202 are further connected by one or more metal structures that connect the metal bonding pads 1102 and 1202 to at least one device in the wafers 1100 and 1200. Accordingly, metal bonding pads 1102 and 1202 serve a bonding function and additionally serve as an electrical connection for a device in one wafer 1100 to at least a device in a second wafer 1200.

The pair of metal bonding pads 1102 and 1202 can be of similar or different widths. In the example, metal bonding pads 1102 and 1202 are shifted with respect to each other to overlap partly onto the multi-interlayer dielectric structure of the opposite wafer. Shifting the metal bonding pads 1102 and 1202 with respect to each other can extend the possibility of connecting circuits to each other that are spatially apart in the horizontal direction. In one example, the width of metal bonding pads 1102 and 1202 is greater than or equal to 1 µm. In one example, the width of metal bonding pads 1102 and 1202 is about 1 µm to about 3 µm. Although a single metal bonding pad pair is illustrated, it is within the scope of this disclosure to include a plurality of metal bonding pad pairs in any of the examples illustrated.

In one example, the first wafer 1100 and second wafer 1200 each includes a plurality of dielectric layers forming multi-interlayer dielectric having interconnecting conducting metal structures (or metal interconnect structures) formed therein that serve as electrical routing between devices in the first wafer 1100 to devices in the second wafer 1200 through the metal bonding pads 1102, 1202. For example, the multi-interlayer dielectric structure 1160 includes vertical interconnect structures (e.g., vias) in via layers 1108, 1112, and 1116, and horizontal metal interconnect layers 1110 and 1114, disposed between a top via and a bottom via layer. Similarly, the second wafer 1200 includes a plurality of layers with interconnect structures. The second multi-interlayer dielectric structure 1260 includes via layers 1208, 1212, and 1216, and horizontal metal interconnect layers 1208 and 1214, disposed between a top via and a bottom via layer. The number of via and metal layers is representative and is not limited, as fewer or more via and metal layers can be provided.

In one example, the vias in the via layer 1116 are connected to more than one devices 1118, 1120, 1122, and 1124, or wire bonding pad 1126, and the vias in the via layer 1216 are connected to more than one devices 1218, 1220, 1222, and 1224. In one example, the devices 1118, 1120, 1122, and 1124 can be transistors. In one example, the devices 1118, 1120, 1122, and 1124 are pixel transistors, and the wafer 1100 is a wafer having photodiodes, and the wafer 1200 is a wafer having logic circuits. However, a pixel wafer and a logic wafer are meant to be representative, and the disclosure is not thereby limited.

In one example, more than one vias in the via layer 1108 is electrically connected to the metal bonding pad 1102 of the first wafer 1100, and more than one vias in the via layer 1208 are connected to the metal bonding pad 1202 of the second wafer 1200. To illustrate the use of metal bonding pads 1102 and 1202 in the signal transmission path, vias 1252, 1254, 1244, 1246, 1240, and metal routing traces 1220, 1222, 1242 in the second wafer 1200 are connected to lead from the devices 1222, 1224 in the second wafer 1200 to the metal bonding pad 1202, while vias 1128, 1142, 1146, 1148, and metal routing traces 1140, 1144 are connected to lead from the metal bonding pad 1102 in the first wafer 1100 to the devices 1122, 1124. Thereby, establishing a signal transmission path from the devices 1222, 1224 in the second wafer 1200 to the devices 1122, 1124 in the first wafer 1100 through the metal bonding pads 1102, 1202.

Therefore, according to one example, the metal bonding pads 1102 and 1202 of a hybrid bonded first 1100 and second 1200 wafer are used for making electrical connections of devices wholly within the first 1104 and second 1138 sides of wafer 1100 and first 1238 and second 1204 sides of wafer 1200. This differs from the use of through-silicon or through-substrates via structures for establish electrical connections, where sufficient area of wafer substrate and multi-layer interconnection area are needed instead of being allocate for circuit element formation or multi-signal routing, thereby placing further constraint on the scaling of semiconductor device.

The width of the metal bonding pads 1102, 1202 of the first 1100 and second 1200 wafers allow for multiple vias connected thereto. In one example, the minimum critical dimension between the edge of via 1128 to the adjacent edge of via 1130 is, for example about 100 nm, and the minimum margin between an outside edge of the via 1130 and an edge 1132 of the metal bonding pad 1102 can be configured based minimum design rule, for example about 50 nm. Therefore, the metal bonding pads 1102, 1102 can accommodate more than one via.

In one example, the electrical connections of the metal bonding pad 1102 can be extended in the horizontal direction to provide connections to devices that are further from the metal bonding pad 1102, or when the metal bonding pad itself cannot accommodate additional vias. For example, the metal bonding pad 1102 is electrically connected to the metal structure 1134 formed in the via layer 1100 that is above the first side 1104 of the wafer 1100. Metal structure 1134 can provide more area for via connections that cannot fit onto metal bonding pad 1102 providing connection extension for routing flexibility. The metal structure 1134 is in turn connected to vertical interconnection structures or vias and additional metal structures in the layers 1110, 1112, 1114, and 1116; thus, providing an electrical connection from the metal bonding pad 1102 to the device 1126. Similarly, the metal bonding pad 1202 can be extended in the horizontal direction or longitude direction to provide connections to devices (for example device 1218) that are further from the metal bonding pad 1202, or when the metal bonding pad 1202 itself cannot accommodate additional vertical interconnection structures or vias. For example, the metal bonding pad 1202 is electrically connected to the metal structure 1134 formed in the via layer 1208 that is below the second side 1204 of the wafer 1200. Metal structure 1226 can provide more area for via connections that cannot fit onto metal bonding pad 1202. The metal structure 1226 is in turn connected to vertical interconnection structures or vias and additional metal structures in the layers 1210, 1212, 1214, and 1216; thus, providing an electrical connection from the metal bonding pad 1102 to the device 1218. The dimensions of metal features 1134 and 1226 can be the same or different to the metal bonding pads 1102 and 1202 in the width, depth, and length.

Figure 7A:
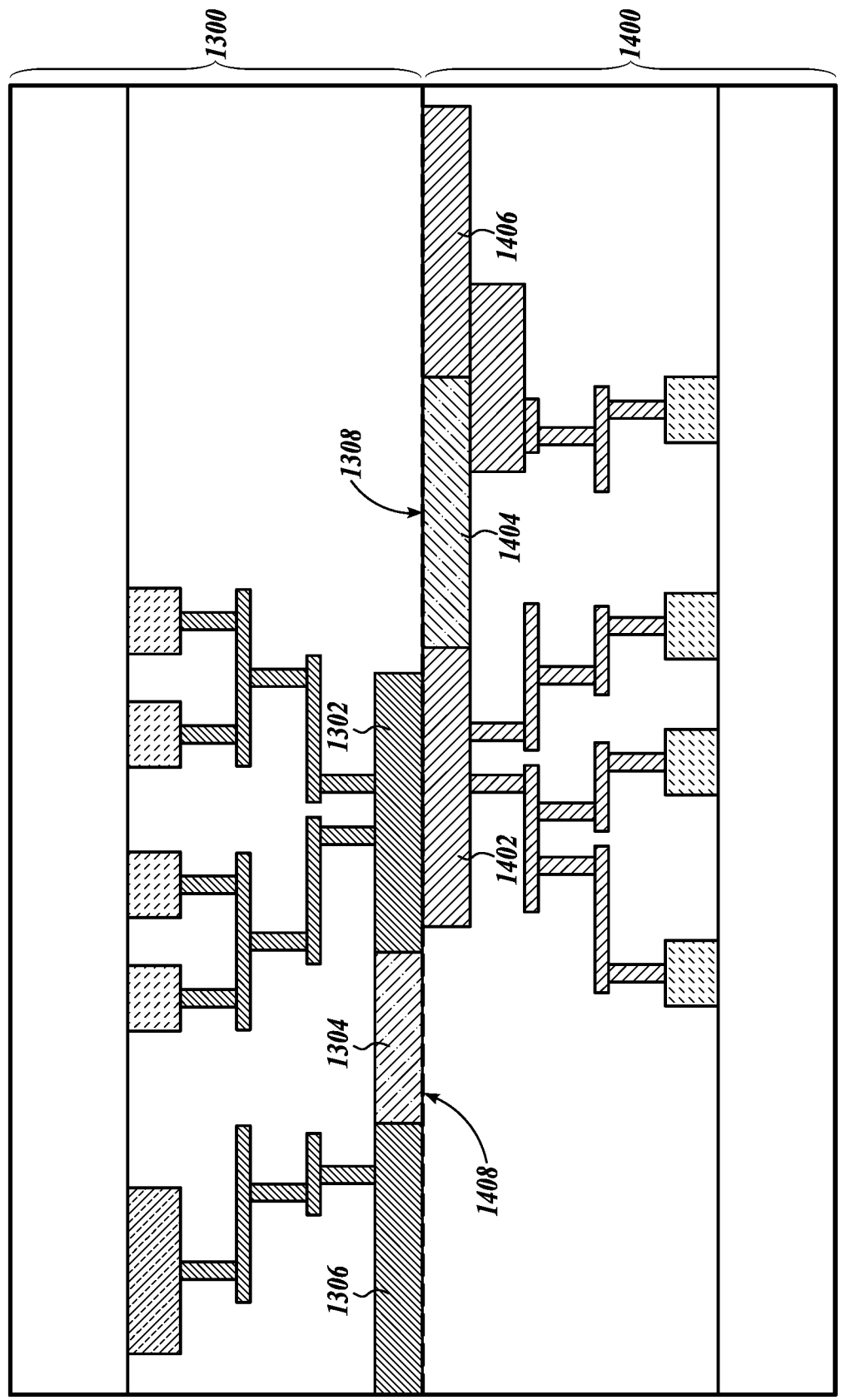
FIG. 7A is an example of a wafer-on-wafer structure in accordance with the present disclosure.

In FIG. 7A, a first wafer 1300 is bonded to a second wafer 1400 using hybrid bonding, which includes metal-to-metal bonding and at least one other different material bonding, such as dielectric-to-dielectric, insulator-to-insulator bonding, or the like. The structure of FIG. 7A is similar in respects to the structure of FIG. 6, with the following differences.

In FIG. 7A, the area for via connections to a hybrid bonding pad 1302 of the first wafer 1300 is horizontally extended by providing a metal feature 1304 (e.g., intermediate metal routing trace) on the first side 1308 and at the same layer as the metal bonding pad 1302 of the first wafer 1300. The metal feature 1304 connects the metal bonding pad 1302 of the first wafer 1300 to a second metal bonding pad or metal feature 1306 on the same wafer 1300 for laterally extending electrical connection enabling additional vertical interconnection structures or vias for connecting devices through the metal bonding pad 1302 to be added increase routing flexibility, wherein such devices can be far from the metal bonding pad 1302 or when the metal bonding pad 1302 cannot accommodate more vertical interconnection structures or vias. Similarly, the area for via connections to a metal bonding pad 1402 for the second wafer 1400 is horizontally extended by providing a metal feature (or intermediate metal routing trace) 1404 formed on the second side 1408 and at the same layer as the metal bonding pad 1402 of the second wafer 1400. The metal feature 1404 connects the metal bonding pad 1402 of the second wafer 1400 to a second metal bonding pad or metal feature 1406 laterally extending electrical connection for adding additional vertical interconnection structures or vias for connecting devices through the metal bonding pad 1402, wherein such devices can be far from the metal bonding pad 1402 or when the metal bonding pad 1402 cannot accommodate more vias.

Figure 7B:
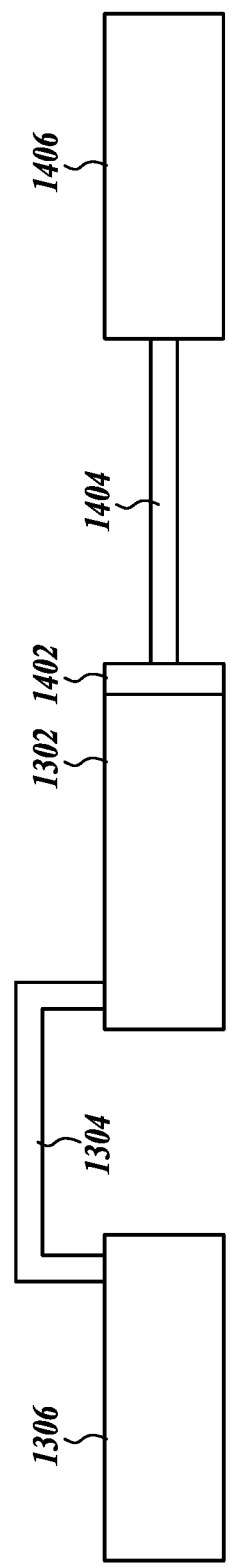
FIG. 7B is top view of the metal bonding pads of the wafer-on-wafer structure of FIG. 7A in accordance with the present disclosure.

Referring to FIG. 7B, the bonding pads 1302 and 1306 of the first wafer 1300 are shown illustrated from a top view, where the metal feature 1304 (intermediate metal routing trace) electrically connects the bonding pads 1302 and 1306 formed within the same interlayer dielectric layer in which the bonding pads 1302 and 1306 are formed. Similarly, the bonding pads 1402 and 1406 of the second wafer 1400 are shown illustrated from a top view, where the metal feature 1404 (intermediate metal routing trace) electrically connects the bonding pads 1402 and 1406 formed within the same interlayer dielectric layer in which the bonding pads 1402 and 1406 are located. The metal routing trace 1304 follows a different path than the metal feature 1404. The bonding pad 1402 is partly hidden from top view as most of bonding pad 1402 lies beneath bonding pad 1302 as illustrated in FIG. 7A.

Accordingly, metal bonding pads 1302 and 1402 function for hybrid bonding of wafer 1300 to 1400 and in addition can function for an electrical connection to connect devices within wafer 1300 to devices within wafer 1400. The dimensions of metal features 1304 and 1404 can be the same or different to the metal bonding pads 1302 and 1402 in the width, depth, and length.

Figure 8:
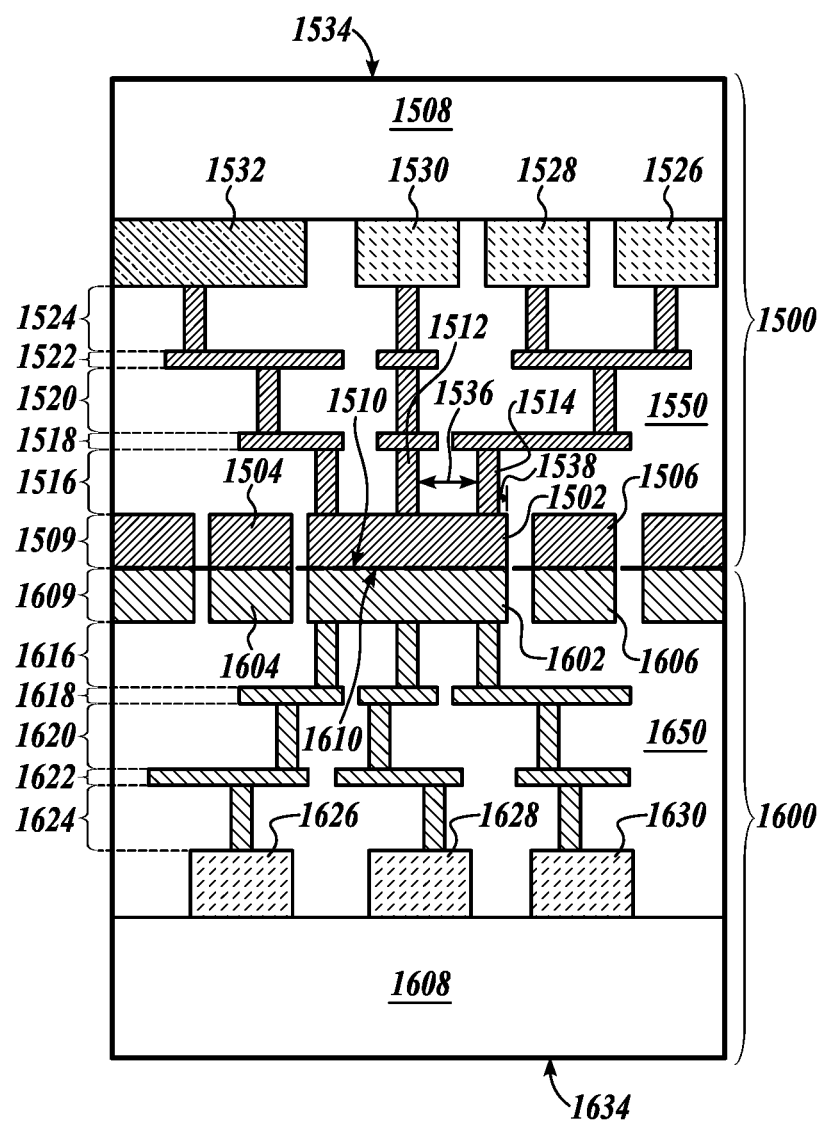
FIG. 8 is an example of a wafer-on-wafer structure in accordance with the present disclosure.

FIG. 8 shows a portion of a first and second vertically stacked wafer-on-wafer structure comprising a first wafer 1500 bonded to a second wafer 1600 using hybrid bonding forming electrical connections between multiple devices on first wafer 1500 and second wafer 1600. The first wafer 1500 has a first side 1510 and a second side 1534 opposite to the first side 1510. The second wafer 1600 has a first side 1634 and a second side 1610 opposite to the first side 1634. The first side 1510 of the first wafer 1500 is bonded to the second side 1610 of the second wafer 1600. The first wafer 1500 includes a substrate 1508 and a multi-interlayer dielectric structure 1550 comprised of a plurality of dielectric layers in which metal features can be formed, formed on substrate 1508. The second wafer 1600 includes a substrate 1608 and a multi-interlayer dielectric structure 1650 comprised of a plurality of dielectric layers in which metal features can be formed, formed substrate 1608. The first wafer 1500 includes a layer 1509 of metal bonding pads 1502, 1504, 1506 embedded in a dielectric material layer of the multi-interlayer dielectric structure 1550, wherein the dielectric material, such as silicon oxide, silicon nitride, encloses the metal bonding pads 1502, 1504, 1506 and one or more metal interconnect structure. The second wafer 1600 includes a layer 1609 of metal bonding pads 1602, 1604, 1606 embedded in a dielectric material layer of the multi-interlayer dielectric structure 1650, wherein the dielectric material, such as silicon oxide, silicon nitride, encloses the metal bonding pads 1602, 1604, 1606 and one or more metal interconnect structure.

Areas of the multi-interlayer dielectric structures 1550 and 1650 that do not include metal bonding pads can be further bonded to each other through dielectric to dielectric bonding. Accordingly, wafer 1500 is bonded to wafer 1600 through a hybrid bonding method which utilizes metal-to-metal bonding and insulator-to-insulator (e.g., dielectric to dielectric) bonding. The method of bonding can include, but is not limited to, adhesives, such as polyimides, thermo-compression, diffusion bonding, pressure joining, and the like.

In one example, metal bonding pads 1502 and 1602 are further connected by one or more metal structures that connect the metal bonding pads 1502 and 1602 to at least one device in the wafers 1500 and 1600 forming electrical connections between bonded wafers 1500, 1600. Accordingly, metal bonding pads 1502 and 1602 serve a bonding function and additionally serve as an electrical connection for a device in one wafer 1500 to a device in a second wafer 1600.

The pair of metal bonding pads 1502 and 1602 are of similar width and are completely superposed with each other. In one example, the width of metal bonding pads 1502 and 1602 is greater than or equal to 1 µm. In one example, the width of metal bonding pads 1502 and 1602 is about 1 µm to about 3 µm. The pairs of metal bonding pads 1504, 1604 and 1506, 1606 are provided as "dummy" pads, to provide metal coverage and an even or level surface to relieve bonding stress improve bonding reliability. The pairs of metal bonding pads 1504, 1604 and 1506, 1606 can be a different width to the metal bonding pads 1502 and 1602.

In one example, the first wafer 1500 and second wafer 1600 each include a plurality of dielectric layers forming multi-interlayer dielectric having interconnecting conducting metal structures formed therein that serve as electrical routing between devices in the first wafer 1500 to devices in the second wafer 1600 through the metal bonding pads 1502, 1602. For example, the multi-interlayer dielectric structure 1550 includes vertical interconnect structures (or vias) in via layers 1516, 1520, and 1524, and horizontal metal interconnect layers 1518 and 1522, disposed between a top via and a bottom via layer. Similarly, the second wafer 1600 includes a plurality of layers with interconnect structures. The second multi-interlayer dielectric structure 1650 includes via layers 1616, 1620, and 1624, and horizontal metal interconnect layers 1618 and 1622, disposed between a top via and a bottom via layer. The number of via and metal layers is representative and is not limited, as fewer or more via and metal layers can be provided.

In one example, the vertical interconnect structures (or vias), for example vertical interconnect structure 1512, in the via layer 1524 are connected to more than one devices 1526, 1528, 1530, or wire bonding pad 1532, and the vertical interconnect structures (or vias) in the via layer 1624 are connected to more than one devices 1626, 1628, or 1630. In one example, the devices 1526, 1528, and 1530 can be transistors. In one example, the devices 1526, 1528, and 1530 are pixel transistors, and the wafer 1500 is a wafer having photodiodes, and the wafer 1600 is a wafer having logic circuits. However, a pixel wafer and a logic wafer are meant to be representative, and the disclosure is not thereby limited.

In one example, more than one vertical interconnect structures (or vias), for example, vertical interconnect structures 1512, 1514, in the via layer 1516 is electrically connected to the metal bonding pad 1502 of the first wafer 1500, and more than one vertical interconnect structures (or vias) in the via layer 1616 is connected to the metal bonding pad 1602 of the second wafer 1600. Therefore, according to one example, the metal bonding pads 1502 and 1602 of a hybrid bonded first wafer 1500 and second wafer 1600 are used for making electrical connections of devices wholly within the first 1510 and second 1534 sides of the wafer 1500 and the first 1634 and second 1610 sides of the wafer 1600. Hence, wafer space can be much efficiently utilized for circuities and signal routing. As such same or more complicate circuitry can be implemented on the wafer without need to increase size of wafers.

The width of the metal bonding pad 1502 of the first wafer 1500 can be configured to allow for multiple vias connected thereto. In one example, the minimum critical dimension 1536 between the edge of via 1512 to the adjacent edge of a vertical interconnect structures (or via) 1514 is, for example about 100 nm based on minimum design rule, and the minimum margin 1538 between an outside edge of the vertical interconnect structures (or via) 1514 and the edge of the metal bonding pad 1502 is 50 nm. Therefore, the metal bonding pads 1502 and 1602 can accommodate more than one via.

Figure 9:
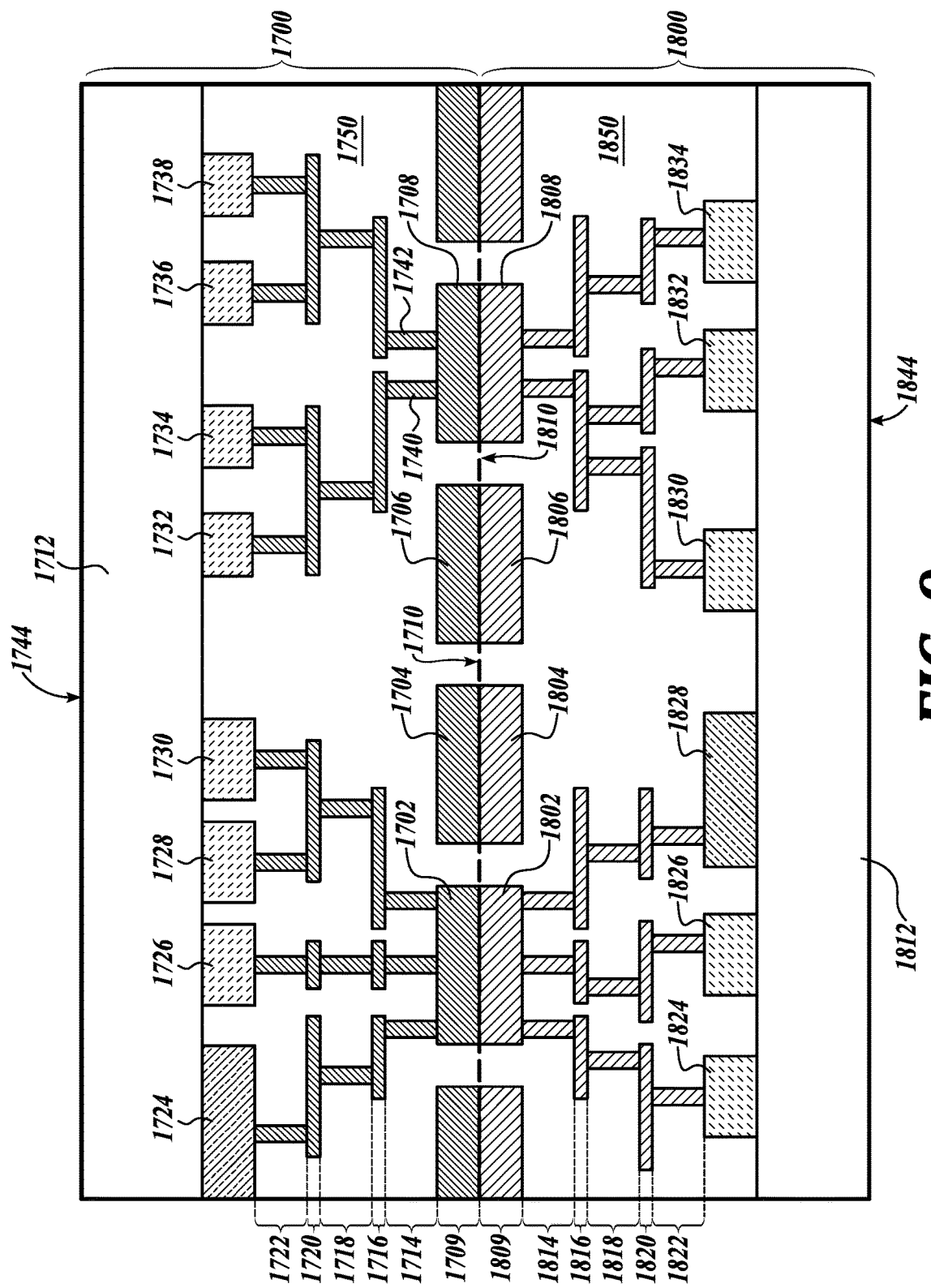
FIG. 9 is an example of a wafer-on-wafer structure in accordance with the present disclosure.

FIG. 9 shows a portion of a first and second vertically stacked wafer-on-wafer structure comprising a first wafer 1700 bonded to a second wafer 1800 using hybrid bonding forming electrical connections between multiple devices on first 1700 and second wafer 1800. The first wafer 1700 has a first side 1710 and a second side 1744 opposite to the first side 1710. The second wafer 1800 has a first side 1844 and a second side 1810 opposite to the first side 1844. The first side 1710 of the first wafer 1700 is bonded to the second side 1810 of the second wafer 1800. The first wafer 1700 includes a substrate 1712 and a multi-interlayer dielectric structure 1750 comprised of a plurality of dielectric layers in which metal features can be formed, formed on the substrate 1712. The second wafer 1800 includes a substrate 1812 and a multi-interlayer dielectric structure 1850 comprised of a plurality of dielectric layers in which metal features can be formed, formed on the substrate 1812. The first wafer 1700 includes a layer 1709 of the metal bonding pads 1702, 1704, 1706, and 1708 embedded in a dielectric material layer of the multi-interlayer dielectric structure 1750, wherein the dielectric material, such as silicon oxide, silicon nitride, encloses the metal bonding pads 1702, 1704, 1706, and 1708 and one or more metal interconnect structure. The metal bonding pads 1802, 1804, 1806, and 1808 embedded in a dielectric material layer 1809 of the multi-interlayer dielectric structure 1850, wherein the dielectric material, such as silicon oxide, silicon nitride, encloses the metal bonding pads 1802, 1804, 1806, and 1808 and one or more metal interconnect structure.

Areas of the multi-interlayer dielectric structures 1750 and 1850 that do not include metal bonding pads can be further bonded to each other through dielectric to dielectric bonding. Accordingly, wafer 1700 is bonded to wafer 1800 through a hybrid bonding method which utilizes metal-to-metal bonding and insulator-to-insulator (e.g., dielectric to dielectric) bonding. The method of bonding can include, but is not limited to, adhesives, such as polyimides, thermo-compression, diffusion bonding, pressure joining, and the like.

In one example, pairs of metal bonding pads 1702, 1802 and 1708, 1808 are further connected by one or more metal interconnection structures that connect the respective metal bonding pads 1702, 1802 and 1708, 1808 to at least one device in the wafers 1700 and 1800, thereby establish electrical connections between wafers 1700, 1800 without need to use TSVs structure, thus can increase amount of useable areas on wafers for circuitry formation and signal routing. Accordingly, metal bonding pads 1702, 1802 and 1708, 1808 serve a bonding function and additionally serve as an electrical connection for a device in one wafer 1700 to a device in a second wafer 1800. In one embodiment, metal bonding pads 1702 and 1802 can provide a first connection path to transmit a first signal controlling operations of devices 1726, 1728, 1730, 1824, 1826, 1828. Metal bonding pads 1708 and 1808 can provide a second connection path to transmit a second signal controlling operations of devices 1732, 1734, 1736, 1738, 1830, 1832, 1834.

The pairs of metal bonding pads 1702, 1802, and 1708, 1808 are of similar width and are superposed with each other. In one example, the width of metal bonding pads 1702, 1802, and 1708, 1808 is greater than or equal to 1 µm. In one example, the width of metal bonding pads 1702, 1802, and 1708, 1808 is about 1 µm to about 3 µm. The pairs of metal bonding pads 1704, 1804, and 1706, 1806 are provided as "dummy" pads, to provide metal coverage and an even or level surface for enhancing bonding strength to relieve bonding stress and can be the same or a different width compared to the metal bonding pads 1702, 1802, and 1708, 1808.

In one example, the first wafer 1700 and second wafer 1800 each include a plurality of dielectric layers having interconnecting conducting metal structures formed therein that serve as electrical routing between devices in the first wafer 1700 to devices in the second wafer 1800 through the metal bonding pad pairs 1702, 1802 and 1708, 1808. For example, the multi-interlayer dielectric structure 1750 includes vertical interconnect structures (or vias) in via layers 1714, 1718, and 1722, and horizontal metal interconnect layers 1716 and 1720, disposed between a top via and a bottom via layer. Similarly, the second wafer 1800 includes a plurality of layers with interconnect structures. The second multi-interlayer dielectric structure 1850 includes via layers 1814, 1818, and 1822, and horizontal metal interconnect layers 1816 and 1820, disposed between a top via and a bottom via layer. The number of via and metal layers is representative and is not limited, as fewer or more via and metal layers can be provided.

In one example, more than one vertical interconnect structures (or vias) in the via layer 1714 is electrically connected to the metal bonding pads 1702 and 1708 of the first wafer 1700, and more than one vertical interconnect structures (or vias) in the via layer 1814 is connected to the metal bonding pads 1802 and 1808 of the second wafer 1800.

In one example, the vertical interconnect structures or (vias) connected to the metal bonding pad 1702 are connected to more than one devices 1726, 1728, 1730, or wire bonding pad 1724, and the vias connected to the metal bonding pad 1802 are connected to more than one devices 1824, 1826, or wire ponding pad 1828. Additionally, the vias connected to the metal bonding pad 1708 are connected to more than one devices 1732, 1734, 1736, 1738, and the vias connected to the metal bonding pad 1808 are connected to more than one devices 1830, 1832, and 1824. In one example, the devices 1726, 1728, 1730, 1824, 1826, 1828, 1732, 1734, 1736, 1738, 1830, 1832, and 1824 can be transistors. In one example, the devices 1726, 1728, 1730, 1824, 1826, 1732, 1734, 1736, 1738 are pixel transistors, and the wafer 1700 is a pixel wafer having photodiodes. In one example, the devices 1824, 1826, 1828, 1830, 1832, 1834 are transistors in logic circuitry. The wafer 1800 is a logic wafer having logic circuits coupled to the pixel wafer through corresponding metal bonding pads to electrically connected to devices (e.g.,) pixel transistors for controlling operations of the devices (e.g., pixel transistors). However, a pixel wafer and a logic wafer are meant to be representative, and the disclosure is not thereby limited.

Therefore, according to one example, more than one pair of metal bonding pads 1702, 1802, and 1708, 1808 of a hybrid bonded first 1700 and second 1800 wafer are used for making electrical connections of devices wholly within the first 1710 and second 1744 sides of wafer 1700 and first 1844 and second 1810 sides of wafer 1800. This differs from the use of through-substrate or through-silicon via structure, where much usable wafer area are taken to form such through-substrate or through-silicon via structure. In other words, signal connection formed within each of the first 1700 and second 800 wafers and between first 1700 and second 800 wafers are formed through metal bonding pads and multi-layer metal interconnection structure without using any through-via structure that passes or penetrates through wafer substrate and/or multi-layer metal interconnection structure completely, thereby increase usage of wafer area and signal routing flexibility.

The width of the metal bonding pads 1702 and 1708 of the first wafer 1700 allows for multiple vertical interconnect structures (or vias) connected thereto. In one example, the minimum critical dimension between the edge of a vertical interconnect structure (or via) 1740 to the adjacent edge of via 1742 is, for example about 100 nm, and the minimum margin between an outside edge of the vertical interconnect structure (or via) 1742 and the edge of the metal bonding pad 1708 is 50 nm. Therefore, the metal bonding pads 1702, 1708, 1802, and 1808 can accommodate more than one vertical interconnect structures (or vias).

Figure 10:
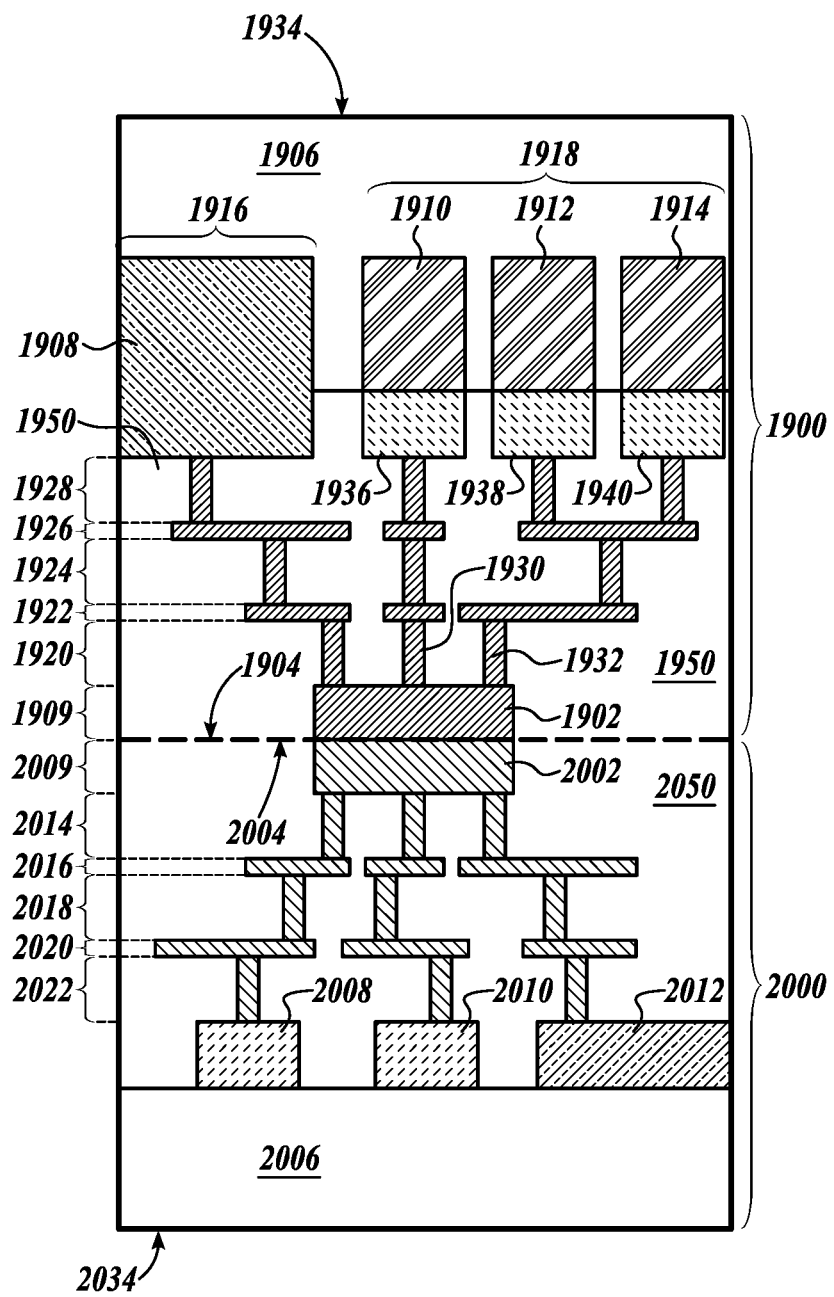
FIG. 10 is an example of a wafer-on-wafer structure in accordance with the present disclosure.

FIG. 10 shows a portion of a first and second vertically stacked wafer-on-wafer structure comprising a first wafer 1900 bonded to a second wafer 2000 using hybrid bonding forming electrical connections between multiple devices on first wafer 1900 and second wafer 2000. The first wafer 1900 has a first side 1904 and a second side 1934 opposite to the first side 1904. The second wafer 2000 has a first side 2034 and a second side 2004 opposite to the first side 2034. The first side 1904 of the first wafer 1900 is bonded to the second side 2004 of the second wafer 2000. The first wafer 1900 includes a substrate 1906 and a multi-interlayer dielectric structure 1950 comprised of a plurality of dielectric layers in which metal features can be formed, formed on the substrate 1906. The second wafer 2000 includes a substrate 2006 and a multi-interlayer dielectric structure 2050 comprised of a plurality of dielectric layers in which metal features can be formed, formed on the substrate 2006. The metal bonding pad 1902 is embedded in a dielectric material layer 1909 of the multi-interlayer dielectric structure 1950, wherein the dielectric material, such as silicon oxide, silicon nitride, encloses the metal bonding pad 1902 and one or more metal interconnect structure. The metal bonding pad 2002 is embedded in a dielectric material layer 2009 of the multi-interlayer dielectric structure 2050, wherein the dielectric material, such as silicon oxide, silicon nitride, encloses the metal bonding pad 2002 and one or more metal interconnect structure.

Areas of the multi-interlayer dielectric structures 1950 and 2050 that do not include metal bonding pads can be further bonded to each other through dielectric to dielectric bonding. Accordingly, wafer 1900 is bonded to wafer 2000 through a hybrid bonding method which utilizes metal-to-metal bonding and insulator-to-insulator (e.g., dielectric to dielectric) bonding. The method of bonding can include, but is not limited to, adhesives, such as polyimides, thermo-compression, diffusion bonding, pressure joining, and the like.

In one example, metal bonding pads 1902 and 2002 are further connected by one or more metal structures that connect the metal bonding pads 1902 and 2002 to at least one device in the wafers 1900 and 2000. Accordingly, metal bonding pads 1902 and 2002 serve a bonding function and additionally serve as an electrical connection for a device in one wafer 1900 to a device in a second wafer 2000.

The pair of metal bonding pads 1902 and 2002 are of similar width and are superposed with each other. In one example, the width of metal bonding pads 1902 and 2002 is greater than or equal to 1 μm. In one example, the width of metal bonding pads 1902 and 2002 is about 1 μm to about 3 μm.

In one example, the first wafer 1900 and second wafer 2000 each include a plurality of dielectric layers forming the multi-interlayer dielectric structures 1950, 2050 having interconnecting conducting metal structures formed therein that serve as electrical routing between devices in the first wafer 1900 to devices in the second wafer 2000 through the metal bonding pads 1902, 2002. For example, the multi-interlayer dielectric structure 1950 includes vertical interconnect structures in via layers 1920, 1924, and 1928, and horizontal metal interconnect layers 1922 and 1926, disposed between a top via and a bottom via layer. Similarly, the second wafer 2000 includes a plurality of layers with interconnect structures. The second multi-interlayer dielectric structure 2050 includes via layers 2014, 2018, and 2022, and horizontal metal interconnect layers 2016 and 2020, disposed between a top via and a bottom via layer. The number of via and metal layers is representative and is not limited, as fewer or more via and metal layers can be provided.

In one example, the first wafer 1900 is a pixel wafer, and the second wafer 2000 is a logic wafer having logic circuits. In one example, the vertical interconnect structures (or vias) in the via layer 1928 are connected to more than one transistors 1936, 1938, 1940, or wire bonding pad 1908, and the vertical interconnect structures (or vias) in the via layer 2022 are connected to more than one devices 2008, 2010, or wire bonding pad 2012. In one example, the transistors 1936, 1938, and 1940 are pixel transistors such that each one is connected to a respective photodiode 1910, 1912, and 1914. Photodiodes 1910, 1912, 1914 and the source/drain of are formed in the semiconductor substrate 1906 and the transistor gates 1936, 1938, 1940 of transistors are formed on the semiconductor substrate 1906. Transistor gates 1936, 1938, and 1940 are further embedded in an interlayer dielectric layer of the multi-interlayer dielectric structure 1950. The photodiodes 1910, 1912, and 1914 comprise an active region 1918 of the wafer 1900. Signals can be routed through metal bonding pads 1902, 2002 to transistor gates 1936, 1938, and 1940 of transistor in response to image sensor operation. In one example, the wire bonding pad 1908 is disposed in a peripheral region 1916 (e.g., backside scribe line region) of the pixel wafer 1900. A pixel wafer and a logic wafer are meant to be representative, and the disclosure is not thereby limited.

In one example, more than one vertical interconnect structures (or vias) in the via layer 1920 is electrically connected to the metal bonding pad 1902 of the first wafer 1900, and more than one via in the via layer 2014 is connected to the metal bonding pad 2002 of the second wafer 2000. Therefore, according to one example, the metal bonding pads 1900 and 2000 of a hybrid bonded first 1700 and second 2000 wafer are used for making electrical connections of devices wholly within the first 1904 and second 1934 sides of the wafer 1900 and first 2034 and second 2004 sides of the wafer 2000. This differs from the use of through-silicon or through-substrate via structure for forming electric connection between wafers The width of the metal bonding pad 1902 of the first wafer 1900 allows for multiple vias connected thereto. In one example, the minimum critical dimension between the edge of a vertical interconnect structures (or via) 1930 to the adjacent edge of vertical interconnect structure (or via) 1930 is, for example about 100 nm, and the minimum margin between an outside edge of the vertical interconnect structure (or via) 1930 and the edge of the metal bonding pad 1902 is 50 nm. The same minimum dimensions can apply to metal bonding pad 2002. Therefore, the metal bonding pads 1900 and 2000 can accommodate more than one vertical interconnect structures (or vias).

Figure 11:
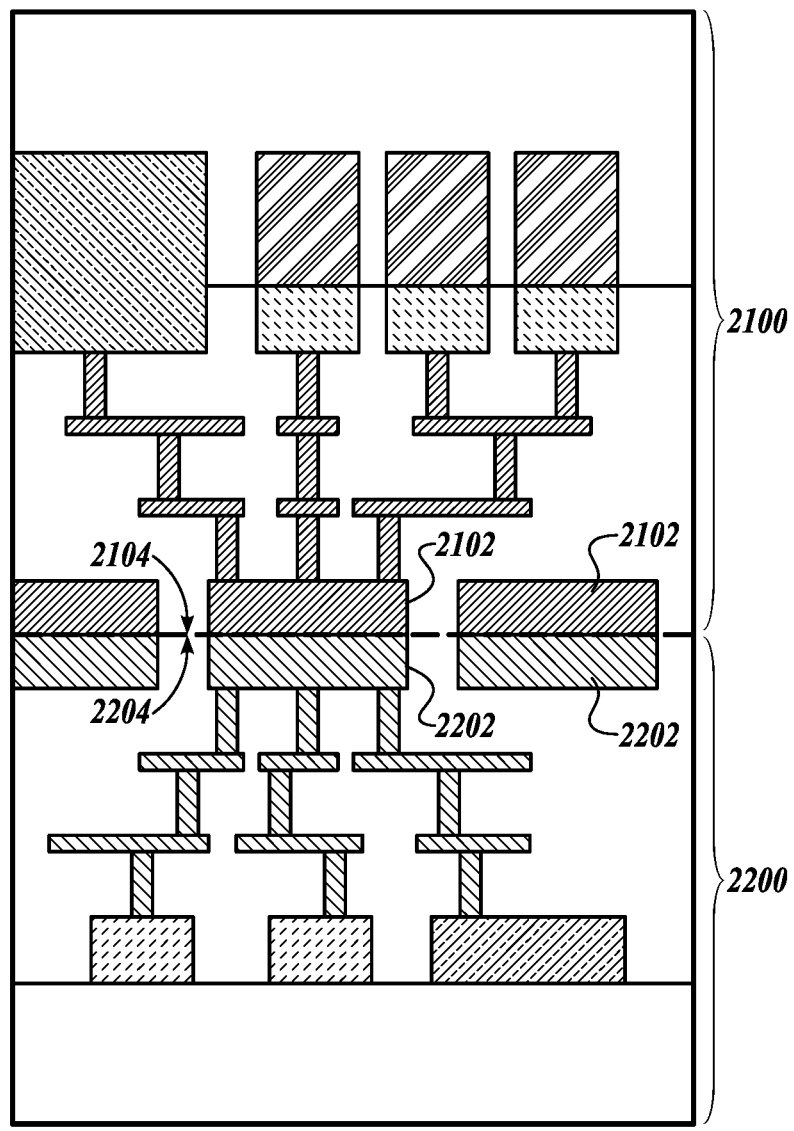
FIG. 11 is an example of a wafer-on-wafer structure in accordance with the present disclosure.

In FIG. 11, a first wafer 2100 is bonded to a second wafer 2200 using a hybrid bonding, which includes metal-to-metal bonding and at least one other different material bonding, such as insulator-to-insulator bonding (e.g., dielectric-to-dielectric bonding), or the like. The structure of FIG. 11 is similar in respects to the structure of FIG. 10, with the following differences.

In FIG. 11, one or more pairs of dummy metal bonding pads can be added to the structure of FIG. 10. A dummy pad 2102 on the first side 2104 of the first wafer 2100 is bonded to a dummy pad 2202 on the second side 2204 of the second wafer 2200. The dummy pads 2102, 2202 can be same width or a different width to the metal bonding pads 2102, 2202 having vias connected thereto. The dummy metal bonding pad 2102 of the first wafer 2100, and the dummy metal bonding pads 2202 of the second wafer 2200 are dummy pads to provide more metal coverage for an even or level surface to improve bonding strength and to relieve bonding stress.

The above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that any specific examples of voltages, currents, frequencies, power range values, times, thicknesses etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of routing electrical connections in a wafer-on- wafer structure, comprising:
    bonding a metal bonding pad on a first side of a first wafer to a metal bonding pad on a second side of a second wafer;
    bonding the first side of the first wafer to the second side of the second wafer with a material different from the metal bonding pads;
    forming one or more metal interconnect structures connecting the metal bonding pad on the first wafer to a first device disposed within the first side and a second side of the first wafer; and
    forming one or more metal interconnect structures connecting the metal bonding pad on the second wafer to a second and a third devices disposed within a first side and the second side of the second wafer, to connect the first device of the first wafer to the second and third devices of the second wafer through the metal bonding pads, wherein the electrical connections of between the devices of the first and the second wafers do not have a through-via that passes completely through the first or the second wafer, and wherein the first device of the first wafer is connected to the second and third devices of the second wafer through a single metal bonding pad pair including the metal bonding pad of the first wafer and the metal bonding pad of the second wafer.

2. The method of claim 1, further comprising a step of bonding a first metal bonding pad of the first wafer to a second metal bonding pad of the second wafer, wherein the second metal bonding pad of the second wafer is shifted with respect to the first metal bonding pad of the first wafer, and the second metal bonding pad of the second wafer partly overlaps with a dielectric material disposed on the first wafer.

3. The method of claim 1, further comprising a step of bonding a first metal bonding pad of the first wafer to a second metal bonding pad of the second wafer, wherein at least one of a length and a width of the first metal bonding pad is different from the second metal bonding pad.

4. The method of claim 1, further comprising a step of bonding a first metal bonding pad of the first wafer to a second and a third metal bonding pads of the second wafer, wherein the second and third metal bonding pads partly overlap with the first metal bonding pad.

5. The method of claim 1, further comprising a step of connecting a first and second metal bonding pad with an intermediate metal routing trace on a same layer in which the first and second metal bonding pads are formed.

6. The method of claim 1, further comprising bonding a plurality of metal bonding pads of the first wafer to a plurality of metal bonding pads of the second wafer.

7. The method of claim 6, wherein at least one metal bonding pad formed on the first wafer or on the second wafer is not connected to the one or more metal interconnect structures to form electrical connection between the first wafer and the second wafer.

8. The method of claim 6, wherein a first metal bonding pad connected to the metal interconnect structures of the first wafer is bonded to a second metal bonding pad connected to the metal interconnect structures of the second wafer, and a third bonding pad of the first wafer is bonded to a fourth metal bonding pad of the second wafer, wherein the third and the fourth metal bonding pads are not connected to the metal interconnect structures to form electrical connection between the first wafer and the second wafer.

9. A wafer-on-wafer semiconductor structure, comprising:
a first wafer having a metal bonding pad on a first side of the first wafer; and
a second wafer having a metal bonding pad on a second side of the second wafer, wherein the metal bonding pad of the first wafer is bonded to the metal bonding pad of the second wafer,
wherein the first side of the first wafer is further bonded to the second side of the second wafer with a material different from the metal bonding pads,
wherein the metal bonding pad of the first wafer is connected to at least two metal interconnect structures connected to a first device disposed within the first side and a second side of the first wafer,
wherein the metal bonding pad of the second wafer is connected to one or more metal interconnect structures connected to a second and a third device disposed within a first side and the second side of the second wafer, and
wherein the first device disposed within the first and second sides of the first wafer is connected to the second and the third devices disposed within the first and second sides of the second wafer through the bonded metal bonding pads, wherein the connections of the first device to the second and the third devices do not have a through-via that passes completely through the first or the second wafer, and wherein the first device of the first wafer is connected to the second and third devices of the second wafer through a single metal bonding pad pair including the metal bonding pad of the first wafer and the metal bonding pad of the second wafer.

10. The wafer-on-wafer structure of claim 9, wherein at least a length and a width of the metal bonding pad of the first wafer is different from the metal bonding pad of the second wafer.

11. The wafer-on-wafer structure of claim 9, wherein a width of the metal bonding pad of the first wafer is substantially the same as a width of the metal bonding pad of the second wafer.

12. The wafer-on-wafer structure of claim 9, wherein the metal bonding pad of the first wafer overlaps partly on the metal bonding pad of the second wafer and partly on a dielectric material formed on the second wafer.

13. The wafer-on-wafer structure of claim 9, comprising a first plurality of metal bonding pads on the first wafer are each bonded to a metal bonding pad on the second wafer, wherein the first plurality of pads on the first wafer are connected to one or more metal interconnect structures connected to the first device disposed within the first side and the second side of the first wafer, and the metal bonding pads on the second wafer are connected to one or more metal interconnect structures connected to the second and the third devices disposed within the first side and the second side of the second wafer.

14. The wafer-on-wafer semiconductor structure of claim 9, comprising one or more dummy metal bonding pads on the first side of the first wafer are bonded to one or more dummy metal bonding pads on the second side of the second wafer, wherein the dummy metal bonding pads are not connected to the interconnect structures.

15. The wafer-on-wafer semiconductor structure of claim 14, wherein the metal bonding pad and the dummy metal bonding pads of the second wafer have a smaller width compared to the metal bonding pad and the dummy metal bonding pads of the first wafer.

16. The wafer-on-wafer semiconductor structure of claim 9, wherein the metal bonding pad of the first wafer is shifted with respect to the metal bonding pad of the second wafer, and the metal pad of the first wafer partly overlaps on a dielectric material disposed on the second wafer.

17. The wafer-on-wafer semiconductor structure of claim 9, wherein a width of the metal bonding pad of the first wafer and the metal bonding pad of the second wafer is from about 1 μm to about 3 μm.

18. The wafer-on-wafer semiconductor structure of claim 9, wherein a minimum critical dimension between an edge of a first via to the adjacent edge of a second via on the metal bonding pad of either the first or second wafer is about 100 nm.

19. The wafer-on-wafer semiconductor structure of claim 9, wherein a minimum margin between an outside edge of a via on the metal bonding pad of either the first or second wafer and the edge of the metal bonding pad is about 50 nm.

20. The wafer-on-wafer semiconductor structure of claim 9, wherein the first device, the second device and the third device comprises at least one of a transistor and a wiring bond pad.

21. The wafer-on-wafer semiconductor structure of claim 9, wherein the first wafer is a pixel wafer and the second wafer is a logic wafer.

22. The wafer-on-wafer semiconductor structure of claim 9, comprising a first metal bonding pad and a second metal bonding pad on a same interlayer dielectric layer, and an intermediate metal routing trace disposed on the same interlayer dielectric layer connects the first and second metal bonding pads.

23. The wafer-on-wafer semiconductor structure of claim 9, wherein comprising a first metal bond pad of first wafer bonded to a second metal bonding pad and a third metal bonding pad of the second wafer, wherein the second and third metal bonding pads partly overlap with the first metal bonding pad.

\* \* \* \* \*

UNITED STATES PATENT AND TRADEMARK OFFICE
CERTIFICATE OF CORRECTION

PATENT NO. : 11,233,088 B2
APPLICATION NO. : 16/900722
DATED : January 25, 2022
INVENTOR(S) : G. Chen et al.

It is certified that error appears in the above-identified patent and that said Letters Patent is hereby corrected as shown below:

On the Title Page

| Column | Line | |
|---|---|---|
| Abstract | 10 | change "devices" to -- device --. |

In the Claims

| Column | Line | |
|---|---|---|
| 20 | 46 | Claim 1, change "on -wafer" to -- on-wafer --. |
| 20 | 59 | Claim 1, change "devices" to -- device --. |
| 20 | 63 | Claim 1, change "connections of" to -- connections --. |
| 21 | 19 | Claim 4, change "pads" to -- pad --. |

Signed and Sealed this
Thirty-first Day of January, 2023

Katherine Kelly Vidal
*Director of the United States Patent and Trademark Office*